(12) United States Patent
Takeuchi

(10) Patent No.: US 8,120,116 B2
(45) Date of Patent: Feb. 21, 2012

(54) SEMICONDUCTOR DEVICE AND PHOTOMASK

(75) Inventor: Masahiko Takeuchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 328 days.

(21) Appl. No.: 12/341,664

(22) Filed: Dec. 22, 2008

(65) Prior Publication Data

US 2009/0166745 A1 Jul. 2, 2009

(30) Foreign Application Priority Data

Dec. 28, 2007 (JP) ................................. 2007-339965
Oct. 2, 2008 (JP) ................................. 2008-257545

(51) Int. Cl.
*H01L 21/70* (2006.01)

(52) U.S. Cl. .................. 257/369; 257/206; 257/E27.098

(58) Field of Classification Search .................. 257/206, 257/365, 368, 369, 390, 391, E27.098, E27.099, 257/E27.661

See application file for complete search history.

(56) References Cited

U.S. PATENT DOCUMENTS

| 5,675,533 | A | 10/1997 | Niuya et al. |
| 5,909,047 | A | 6/1999 | Takahashi |
| 6,597,041 | B2* | 7/2003 | Ohbayashi ................... 257/369 |
| 6,940,106 | B2 | 9/2005 | Shino |
| 2004/0178516 | A1 | 9/2004 | Ogata |
| 2004/0212018 | A1 | 10/2004 | Shino |
| 2006/0203530 | A1 | 9/2006 | Venkatraman et al. |

FOREIGN PATENT DOCUMENTS

| JP | 09-321152 | 12/1997 |
| JP | 2004-273642 | 9/2004 |
| JP | 2004-273972 | 9/2004 |
| JP | 2004-327796 | 11/2004 |

* cited by examiner

*Primary Examiner* — Julio J Maldonado
(74) *Attorney, Agent, or Firm* — McDermott Will & Emery LLP

(57) ABSTRACT

Shared contact holes SC1 and SC2 reach both gate electrode layers GE1 and GE2 and a drain region PIR. In a planar view, a sidewall E2 of gate electrode layers GE1 and GE2 is shifted toward a side of a sidewall E4 from a virtual extended line E1a of the sidewall E1. In a planar view, a center line of a line width D1 in a portion that shared contact holes SC1 and SC2 of gate electrode layers GE1 and GE2 reach is located while shifted with respect to a center line of a line width D2 in a portion located on channel formation regions CHN1 and CHN2 of gate electrode layers GE1 and GE2. Therefore, a semiconductor device and a photomask that can suppress an opening defect of the shared contact hole are obtained.

10 Claims, 35 Drawing Sheets

SEMICONDUCTOR DEVICE AND PHOTOMASK

BACKGROUND OF THE INVENTION

1. Field of the Invention

The present invention relates to a semiconductor device and a photomask, particularly to a semiconductor device having a shared contact hole that reaches both a gate electrode layer and an impurity region and a photomask that is used in patterning of the gate electrode layer.

2. Description of the Background Art

For example, Japanese Patent Laying-Open Nos. 09-321152, 2004-273642, 2004-273972, and 2004-327796 disclose the semiconductor device having the shared contact hole that reaches both the gate electrode layer and the impurity region.

Usually the shared contact hole has a tapered shape in section in which an opening diameter is decreased from an opening end toward a deep position. Therefore, when an etching film such as an insulator is etched to make the shared contact hole, an etching area of the etching film is reduced with the progress of etching. The reduction of the etching area obstructs the progress of the etching, resulting in a conductive problem such as an opening defect in which the shared contact hole does not reach an active layer (impurity region).

For example, during the etching for making the shared contact hole, the etching is obstructed in the middle of the etching by a projection of a sidewall spacer located in a gate electrode layer sidewall. Therefore, in a planar view, unless a distance from an end (end that is not etched by the etching in making the shared contact hole) of the sidewall spacer to an edge portion in a long-side direction of the shared contact hole is largely ensured, a residue is generated in a process of etching a liner nitride film on the sidewall spacer, thereby generating the opening defect.

SUMMARY OF THE INVENTION

In view of the foregoing, an object of the invention is to provide a semiconductor device and a photomask that can suppress the opening defect of the shared contact hole.

An aspect in accordance with the invention provides a semiconductor device including a semiconductor substrate having a main surface; an impurity region formed in the main surface; an insulated gate field effect transistor formed in the semiconductor substrate; and an insulator formed on the impurity region and the insulated gate field effect transistor. The insulated gate field effect transistor includes a pair of source/drain regions formed in the main surface; and a gate electrode layer formed on a channel formation region with a gate insulator interposed therebetween, the channel formation region being sandwiched between the pair of source/drain regions. The insulator has a shared contact hole reaching both the gate electrode layer and the impurity region. The gate electrode layer includes first and second sidewalls and third and fourth sidewalls, the first and third sidewalls being located opposite to each other, the second and fourth sidewalls being located opposite to each other. In a planar view, the second sidewall in a portion that the shared contact hole of the gate electrode layer reaches is shifted toward sides of the third and fourth sidewalls from a virtual extended line of the first sidewall in a portion located on the channel formation region of the gate electrode layer. In a planar view, a center line of a line width in the portion that the shared contact hole of the gate electrode layer reaches is located while shifted with respect to a center line of a line width in the portion located on the channel formation region of the gate electrode layer.

In the aspect of the invention, "the center lines are located while shifted from each other" shall mean that the center lines are not located on the same straight line, and the concept that the center lines are located while shifted from each other includes the case in which the center lines are parallel to each other and the case in which the center lines are intersected while inclined relative to each other.

In the semiconductor device of the aspect of the invention, in the planar view, the second sidewall in the portion that the shared contact hole of the gate electrode layer reaches is shifted toward sides of the third and fourth sidewalls from the virtual extended line of the first sidewall in the portion located on the channel formation region of the gate electrode layer. Therefore, a distance between the second sidewall in the portion that the shared contact hole of the gate electrode layer reaches and the edge of the shared contact hole can be increased to suppress the generation of the opening defect during the etching in making the shared contact hole.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 33 is a plan view showing an active region electrically separated by an isolation structure and an impurity region formed in the active region.

FIG. 34 is a plan view showing a configuration in which a gate electrode layer is added to the planar layout of FIG. 33.

FIG. 35 is a plan view showing arrangement positions of usual contact holes and shared contact holes made in an inter-layer insulator with which the gate electrode layer is covered.

FIG. 36 is a plan view showing a pattern of a conductive layer formed on the inter-layer insulator of FIG. 35.

FIG. 37 is a plan view showing arrangement positions of via holes made in an inter-layer insulator with which a conductive layer is covered.

FIG. 38 is a plan view showing a pattern of a conductive layer formed on the inter-layer insulator of FIG. 37.

DESCRIPTION OF THE PREFERRED EMBODIMENTS

Preferred embodiments of the invention will be described below with reference to the accompanying drawings.

First Embodiment

Figure 1:
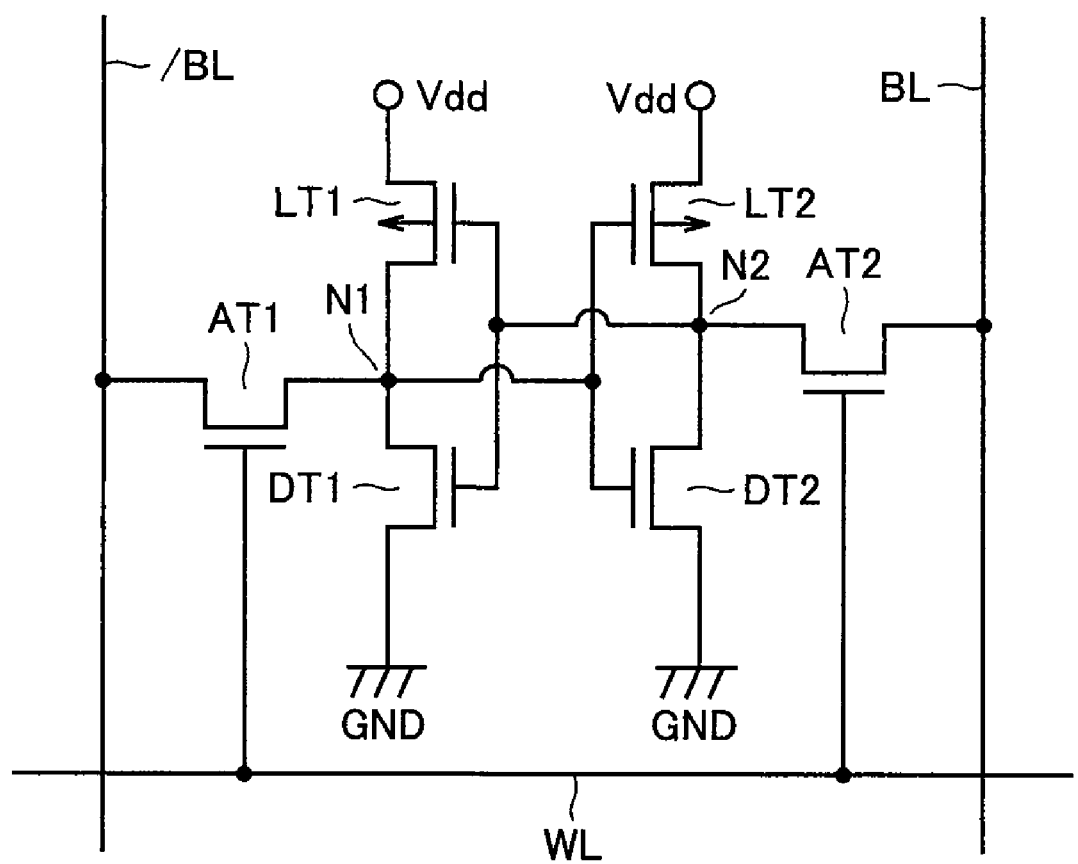
FIG. 1 is an equivalent circuit diagram showing an SRAM memory cell.

Referring to FIG. 1, an SRAM is a volatile semiconductor memory device, and a memory cell of the SRAM is a full CMOS (Complementary Metal Oxide Semiconductor) type memory cell.

In the SRAM, the memory cell is disposed in each of intersections of complementary data lines (bit lines) BL and /BL and word lines WL. Complementary data lines (bit lines) BL and /BL and word lines WL are disposed in a matrix shape. The memory cell includes a flip-flop circuit provided with a pair of inverter circuits and two access transistors AT1 and AT2. Cross-coupled two storage nodes N1 and N2 are formed to obtain a bistable state of (High, Low) or (Low, High) by the flip-flop circuit. The memory cell continuously retains the bistable state as long as a predetermined power supply voltage is applied to the memory cell.

Each of access transistors AT1 and AT2 includes an n-channel MOS transistor (hereinafter referred to as nMOS transistor). One of a source and a drain of access transistor AT1 is electrically connected to storage node N1, and the other of the source and the drain is electrically connected to bit line /BL. One of the source and the drain of access transistor AT2 is electrically connected to storage node N2, and the other of the source and the drain is electrically connected to bit line BL. Each gate of access transistors AT1 and AT2 is electrically connected to word line WL. A conduction state and a non-conduction state of access transistor AT1 and AT2 are controlled through word line WL.

The inverter circuit includes one driver transistor DT1 (or DT2) and one load transistor LT1 (or LT2).

Each of the pair of driver transistors DT1 and DT2 is formed by the NMOS transistor. Each source of driver transistors DT1 and DT2 is electrically connected to GND (ground potential). The drain of driver transistor DT1 is electrically connected to storage node N1, and the drain of driver transistor DT2 is electrically connected to storage node N2. The gate of driver transistor DT1 is electrically connected to storage node N2, and the gate of driver transistor DT2 is electrically connected to storage node N1.

Each of the pair of load transistors LT1 and LT2 is formed by a p-channel MOS transistor (hereinafter referred to as pMOS transistor). Each source of load transistors LT1 and LT2 is electrically connected to a Vdd power supply voltage. The drain of load transistor LT1 is electrically connected to storage node N1, and the drain of load transistor LT2 is electrically connected to storage node N2. The gate of load transistor LT1 is electrically connected to storage node N2, and the gate of load transistor LT2 is electrically connected to storage node N1.

In writing data in the memory cell, word line WL is selected to put access transistors AT1 and AT2 in the conduction state, and a voltage is forcedly applied to bit line pair BL and /BL according to a desired logical value, thereby setting the flip-flop circuit at one of the bistable states. In reading the data from the memory cell, access transistors AT1 and AT2 are put in the conduction state, and potentials at storage nodes N1 and N2 are transferred to bit lines BL and /BL.

In a configuration of the semiconductor device of the first embodiment, a gate electrode layer of load transistor LT1 and a drain region of load transistor LT2 are electrically connected to each other by a shared contact, and a gate electrode layer of load transistor LT2 and a drain region of load transistor LT1 are electrically connected to each other by a shared contact. The configuration will be described below.

Figure 2:
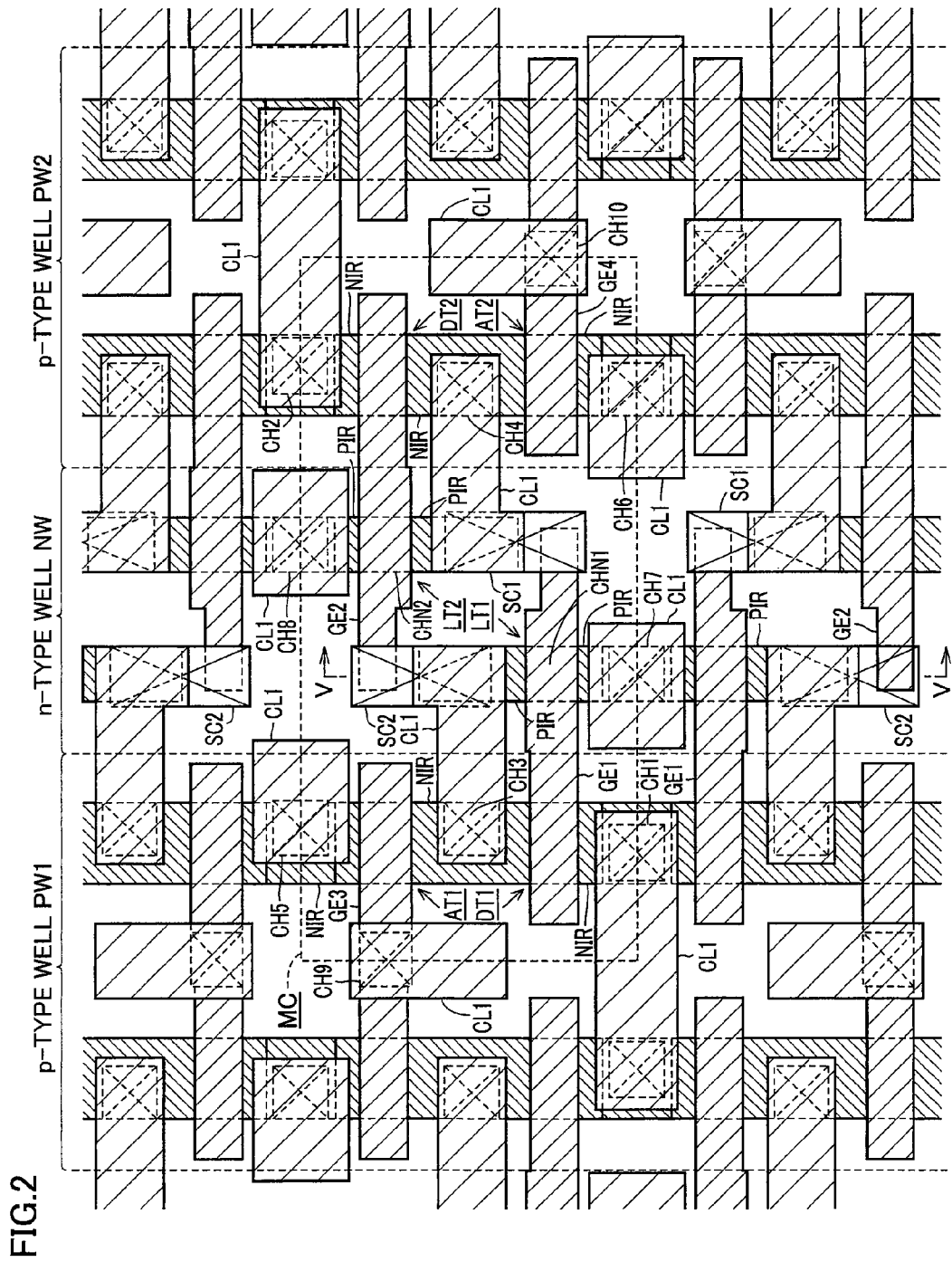
FIG. 2 is a plan view schematically showing a first layer from the bottom in a planar layout configuration of a semiconductor device according to a first embodiment of the invention.
Figure 5:
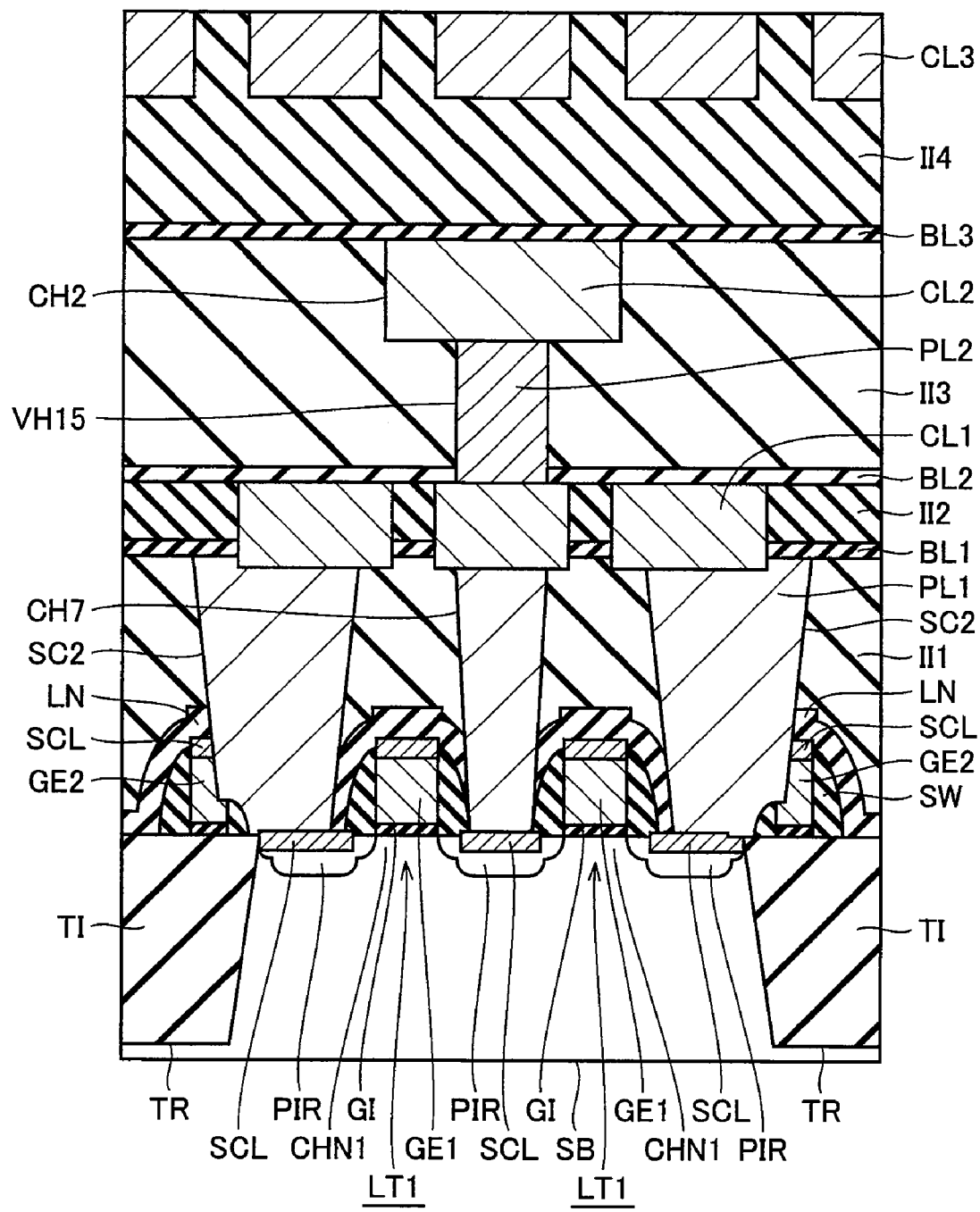
FIG. 5 is a schematic sectional view taken on a line V-V of FIGS. 2 to 4.

Referring to FIGS. 2 and 5, a trench isolation structure including STI (Shallow Trench Isolation) is formed in a main surface of a semiconductor substrate SB. The trench isolation structure includes a trench isolation groove TR and a filling material TI. Trench isolation groove TR is formed in the main surface of semiconductor substrate SB, and groove TR is filled with filling material TI made of a silicon oxide.

The plural SRAM memory cells are formed in the main surface of semiconductor substrate SB isolated by the trench isolation structure. Pair of driver transistors DT1 and DT2, pair of access transistors AT1 and AT2, and pair of load transistors LT1 and LT2 are formed in one SRAM memory cell region MC (region surrounded by a broken line of FIG. 2).

Each of pair of driver transistors DT1 and DT2 and each of pair of access transistors AT1 and AT2 are formed by the nMOS transistor, and driver transistors DT1 and DT2 and access transistors AT1 and AT2 are formed in p-type well regions PW1 and PW2 of the main surface of semiconductor substrate SB. Each of pair of load transistors LT1 and LT2 is formed by the pMOS transistor, and the load transistors LT1 and LT2 are formed in an n-type well region NW of the main surface of semiconductor substrate SB.

Driver transistor DT1 includes a gate electrode layer GE1 and a pair of n-type impurity regions NIR and NIR which constitutes a pair of source/drain regions. N-type impurity regions NIR and NIR are formed with a spacing in the main surface of semiconductor substrate SB in p-type well region PW1. Gate electrode layer GE1 is formed on a channel formation region with a gate insulator (not shown) interposed therebetween, and the channel formation region is sandwiched between pair of n-type impurity regions NIR and NIR.

Driver transistor DT2 includes a gate electrode layer GE2 and pair of n-type impurity regions NIR and NIR which constitutes pair of source/drain regions. N-type impurity regions NIR and NIR are formed with a spacing in the main surface of semiconductor substrate SB in p-type well region PW2. Gate electrode layer GE2 is formed on the channel formation region with a gate insulator (not shown) interposed therebetween, and the channel formation region is sandwiched between pair of n-type impurity regions NIR and NIR.

Access transistor AT1 includes a gate electrode layer GE3 and pair of n-type impurity regions NIR and NIR which constitutes pair of source/drain regions. N-type impurity regions NIR and NIR are formed with a spacing in the main surface of semiconductor substrate SB in p-type well region PW1. Gate electrode layer GE3 is formed on the channel formation region with a gate insulator (not shown) interposed therebetween, and the channel formation region is sandwiched between pair of n-type impurity regions NIR and NIR.

Access transistor AT2 includes a gate electrode layer GE4 and pair of n-type impurity regions NIR and NIR which constitutes pair of source/drain regions. N-type impurity regions NIR and NIR are formed with a spacing in the main surface of semiconductor substrate SB in p-type well region PW2. Gate electrode layer GE4 is formed on the channel formation region with a gate insulator (not shown) interposed therebetween, and the channel formation region is sandwiched between pair of n-type impurity regions NIR and NIR.

Load transistor LT1 includes gate electrode layer GE1 and a pair of p-type impurity regions PIR and PIR which constitutes pair of source/drain regions. P-type impurity regions PIR and PIR are formed with a spacing in the main surface of semiconductor substrate SB in n-type well region NW. Gate electrode layer GE1 is formed on a channel formation region CHN1 with a gate insulator GI interposed therebetween, and channel formation region CHN1 is sandwiched between pair of p-type impurity regions PIR and PIR.

Load transistor LT2 includes gate electrode layer GE2 and pair of p-type impurity regions PIR and PIR which constitutes pair of source/drain regions. P-type impurity regions PIR and PIR are formed with a spacing in the main surface of semiconductor substrate SB in n-type well region NW. Gate electrode layer GE2 is formed on a channel formation region CHN2 with gate insulator GI interposed therebetween, and channel formation region CHN2 is sandwiched between pair of p-type impurity regions PIR and PIR.

The drain region of driver transistor DT1 and one of pair of source/drain regions of access transistor AT1 are formed by identical n-type impurity region NIR. The drain region of driver transistor DT2 and one of pair of source/drain regions of access transistor AT2 are formed by identical n-type impurity region NIR.

Gate electrode layer GE1 of driver transistor DT1 and gate electrode layer GE1 of load transistor LT1 are formed by an identical conductive layer. Gate electrode layer GE2 of driver transistor DT2 and gate electrode layer GE2 of load transistor LT2 are formed by an identical conductive layer.

Mainly referring to FIG. 5, each inside of plural contact holes CH1 to CH8 and shared contact holes SC1 and SC2 is filled with a conductive layer PL1 (FIG. 5). An insulator BL1 and an inter-layer insulator II2 are sequentially laminated on inter-layer insulator II1. For example, insulator BL1 is made of a silicon nitride, a silicon carbide, a silicon oxy-carbide, or a silicon carbonitride. For example, inter-layer insulator II2 is made of a silicon oxide. Plural through-holes are made in insulator BL1 and inter-layer insulator II2, and each of the plural through-holes is filled with each of plural conductive layers (first metal layer) CL1. A conductive layer pattern is formed by plural conductive layers CL1.

Mainly referring to FIG. 2, specifically, contact holes CH1 and CH2 that reach each source region of driver transistors DT1 and DT2 are made in liner nitride film LN and inter-layer insulator II1. Contact holes CH3 and CH4 that reach one (each drain region of driver transistors DT1 and DT2) of pair of source/drain regions of access transistors AT1 and AT2 are made in liner nitride film LN and inter-layer insulator II1. Contact holes CH5 and CH6 that reach the other of pair of source/drain regions of access transistors AT1 and AT2 are made in liner nitride film LN and inter-layer insulator II1. Contact holes CH7 and CH8 that reach each source region of load transistors LT1 and LT2 are made in liner nitride film LN and inter-layer insulator II1.

Shared contact hole SC1 that reaches both gate electrode layer GE1 of load transistor LT1 and the drain region of load transistor LT2 is made in liner nitride film LN and inter-layer insulator II1. Shared contact hole SC2 that reaches both gate electrode layer GE2 of load transistor LT2 and the drain region of load transistor LT1 is made in liner nitride film LN and inter-layer insulator II1.

Mainly referring to FIG. 5, each inside of plural contact holes CH11 to CH18 and shared contact holes SC1 and SC2 is filled with a conductive layer PL1 (FIG. 5). An insulator BL1 and an inter-layer insulator II2 are sequentially laminated on inter-layer insulator II1. For example, insulator BL1 is made of a silicon nitride, a silicon carbide, a silicon oxy-carbide, or a silicon carbonitride. For example, inter-layer insulator II2 is made of a silicon oxide. Plural through-holes are made in insulator BL1 and inter-layer insulator II2, and each of the plural through-holes is filled with each of plural conductive layers (first metal layer) CL1. A conductive layer pattern is formed by plural conductive layers CL1.

Mainly referring to FIG. 2, conductive layer PL1 in shared contact hole SC1 and conductive layer PL1 in contact hole CH4 are electrically connected by conductive layer CL1. Therefore, gate electrode layer GE1 of load transistor LT1, the drain region of load transistor LT2, the drain region of driver transistor DT2, and one of the pair of source/drain regions of access transistor AT2 are electrically connected to one another.

Conductive layer PL1 in shared contact hole SC2 and conductive layer PL1 in contact hole CH3 are electrically connected by conductive layer CL1. Therefore, gate electrode layer GE2 of load transistor LT2, the drain region of load transistor LT1, the drain region of driver transistor DT1, and one of the pair of source/drain regions of access transistor AT1 are electrically connected to one another.

Conductive layer PL1 in each of contact holes CH1, CH2, and CH5 to CH8 is individually electrically connected to conductive layer CL1.

Mainly referring to FIG. 5, an insulator BL2 and an inter-layer insulator II3 are sequentially laminated on inter-layer insulator II2. For example, insulator BL2 is made of a silicon nitride, a silicon carbide, a silicon oxy-carbide, or a silicon carbonitride. For example, inter-layer insulator II3 is made of a silicon oxide. Plural via holes VH11 to VH18 are made in insulator BL2 and inter-layer insulator II3, and a conductive layer embedding trench is made in a surface of inter-layer insulator II3 so as to communicate with each of plural via holes VH11 to VH18.

A conductive layer PL2 is embedded in each of plural via holes VH11 to VH18. Each of plural conductive layers (second metal layer) CL2 is embedded in each of plural conductive layer embedding trenches. A conductive layer pattern is formed by plural conductive layers CL2.

Figure 3:
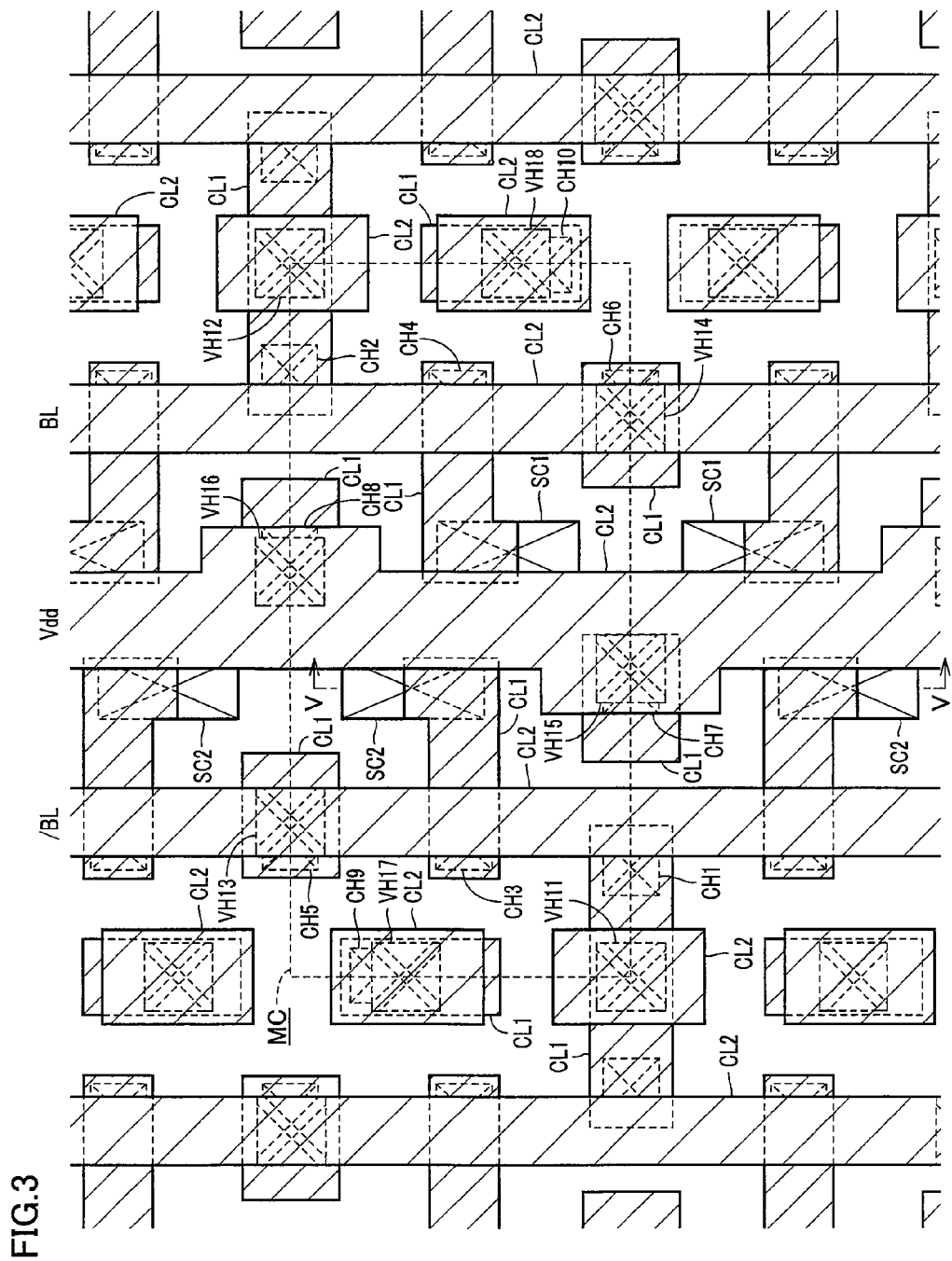
FIG. 3 is a plan view schematically showing a second layer from the bottom in the planar layout configuration of the semiconductor device of the first embodiment.

Mainly referring to FIG. 3, conductive layer CL2 electrically connected to the other of the pair of source/drain regions of access transistor AT1 through via hole VH13 and contact hole CH5 acts as bit line /BL. Conductive layer CL2 electrically connected to the other of the pair of source/drain regions of access transistor AT2 through via hole VH14 and contact hole CH6 acts as bit line BL. Conductive layer CL2 that is electrically connected to the source region of load transistor LT1 through via hole VH15 and contact hole CH7 and electrically connected to the source region of load transistor LT2 through via hole VH16 and contact hole CH8 acts as power supply line Vdd. Bit lines BL and /BL and power supply line Vdd are extended in parallel to a lengthwise direction of the drawings.

Conductive layer PL2 in each of via holes VH11, VH12, VH17, and VH18 is individually electrically connected to conductive layer CL2.

Mainly referring to FIG. 5, an insulator BL3 and an inter-layer insulator II4 are sequentially laminated on inter-layer insulator II3. For example, insulator BL3 is made of a silicon nitride, a silicon carbide, a silicon oxy-carbide, or a silicon carbonitride. For example, inter-layer insulator II4 is made of a silicon oxide. Plural via holes VH21 to VH24 are made in insulator BL3 and inter-layer insulator II4, and a conductive layer embedding trench is made in a surface of inter-layer insulator II4 so as to communicate with each of plural via holes VH21 to VH24.

A conductive layer (not shown) is embedded in each of plural via holes VH21 to VH24. Each of plural conductive layers (third metal layer) CL3 is embedded in each of plural conductive layer embedding trenches. A conductive layer pattern is formed by plural conductive layers CL3.

Figure 4:
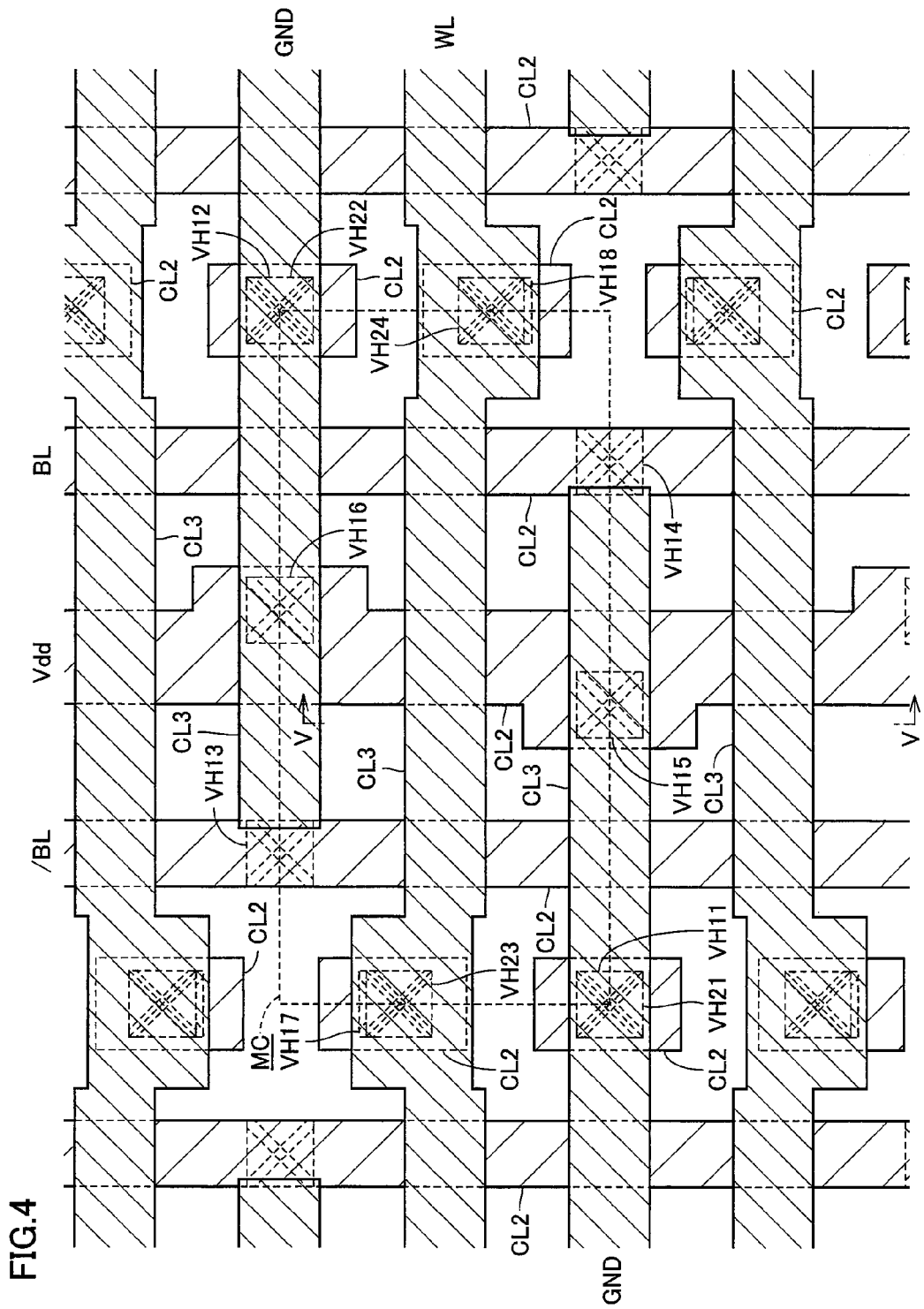
FIG. 4 is a plan view schematically showing a third layer from the bottom in the planar layout configuration of the semiconductor device of the first embodiment.

Mainly referring to FIG. 4, conductive layer CL3 electrically connected to the source region of driver transistor DT1 through via hole VH21, via hole VH11, and contact hole CH1 acts as a GND line. Conductive layer CL3 electrically connected to the source region of driver transistor DT2 through via hole VH22, via hole VH12, and contact hole CH2 acts as the GND line. Conductive layer CL3 that is electrically connected to gate electrode layer GE3 of access transistor AT1 through via hole VH23, via hole VH17, and contact hole CH9 and electrically connected to gate electrode layer GE3 of access transistor AT2 through via hole VH24, via hole VH18, and contact hole CH10 acts as word line WL. The GND line and word line WL are extended in parallel to a crosswise direction of the drawings.

A configuration of a neighborhood of the shared contact hole in the semiconductor device of the first embodiment will be described in detail.

Figure 6:
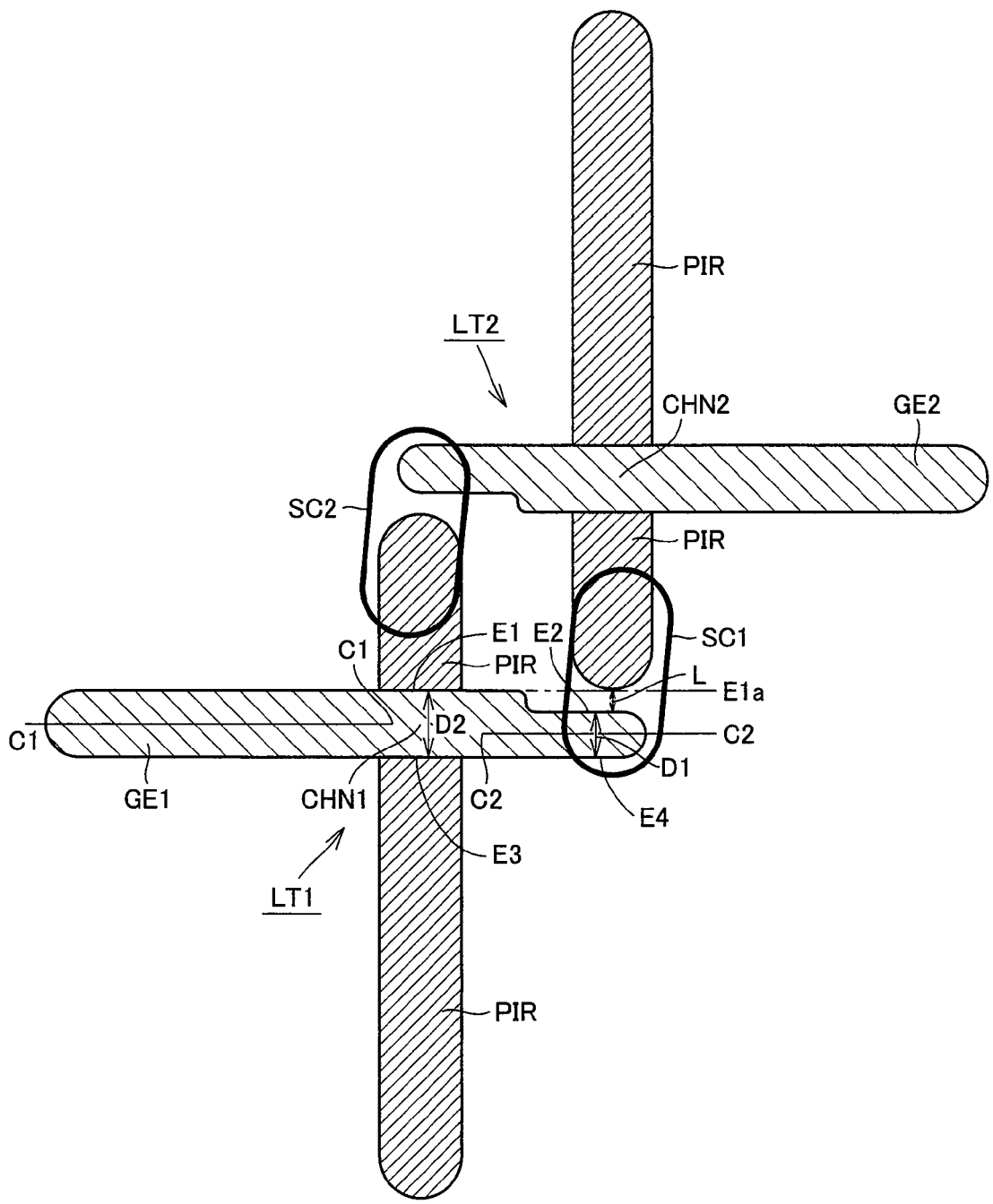
FIG. 6 is an enlarged plan view schematically showing a neighborhood of a shared contact hole in the semiconductor device of the first embodiment.

Referring to FIG. 6, shared contact hole SC1 reaches both gate electrode layer GE1 of load transistor LT1 and drain region (p-type impurity region) PIR of load transistor LT2. Shared contact hole SC2 reaches both gate electrode layer GE2 of load transistor LT2 and drain region (p-type impurity region) PIR of load transistor LT1.

Gate electrode layer GE1 includes sidewalls E1 and E2 and sidewalls E3 and E4. In a planar view, gate electrode layer GE1 includes sidewalls E1 and E2, and sidewalls E3 and E4. Sidewall E1 and sidewall E3 are located opposite to each other, and sidewall E2 and sidewall E4 are located opposite to each other. In the planar view, sidewall E2 in a portion that shared contact hole SC1 of gate electrode layer GE1 reaches is shifted toward sides of sidewalls E3 and E4 from a virtual extended line E1a of sidewall E1 in a portion located on channel formation region CHN1 of load transistor LT1 of gate electrode layer GE1. In the planar view, a center line (line C2-C2) of a line width D1 in the portion that shared contact hole SC1 of gate electrode layer GE1 reaches is shifted toward the side of sidewall E4 from a center line (line C1-C1) of a line width D2 in the portion located on channel formation region CHN1 of gate electrode layer GE1. Therefore, line width D1 is shorter than line width D2. Line width D1 and line width D2 are defined by sidewall E1, sidewall E3, and a line width in a perpendicular direction.

The position shift of sidewall E2 with respect to virtual extended line E1a of sidewall E1 is generated by providing a notch in the portion that shared contact hole SC1 of gate electrode layer GE1 reaches. That is, in the planar view, the portion that shared contact hole SC1 of gate electrode layer GE1 reaches has the notch such that sidewall E2 is retreated toward the side of sidewall E3 with respect to virtual extended line E1a of sidewall E1.

Sidewall E2 is substantially parallel to sidewall E1. Sidewall E4 in the portion that shared contact hole SC1 of gate electrode layer GE1 reaches and sidewall E3 in the portion located on channel formation region CHN1 of gate electrode layer GE1 are substantially located on the same straight line. In the planar view, preferably the shortest distance between an end of drain region (p-type impurity region) PIR of load transistor LT2 and sidewall E2 is not lower than 5 nm.

Gate electrode layer GE2 has a configuration similar to that of gate electrode layer GE1.

A method for producing the semiconductor device of the first embodiment will be described below.

Figure 7:
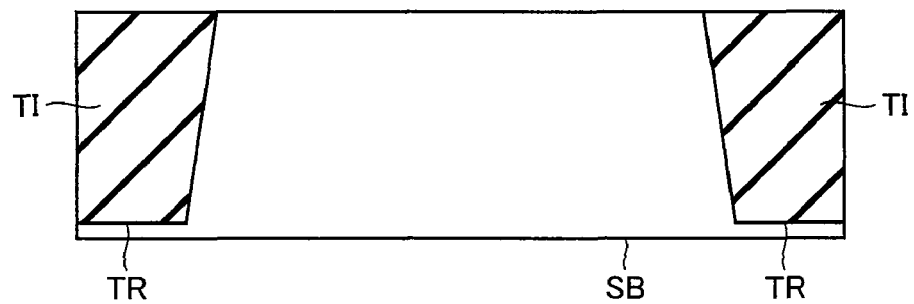
FIGS. 7 to 15 are schematic diagrams showing a method for producing the semiconductor device of the first embodiment in order of process.

Referring to FIG. 7, p-type well regions PW1 and PW2 and n-type well region NW are formed in semiconductor substrate SB. Trench isolation groove TR is formed in the main surface of semiconductor substrate SB, and groove TR is filled with filling material Tr made of the silicon oxide, thereby obtaining the trench isolation structure formed by STI.

Figure 8:
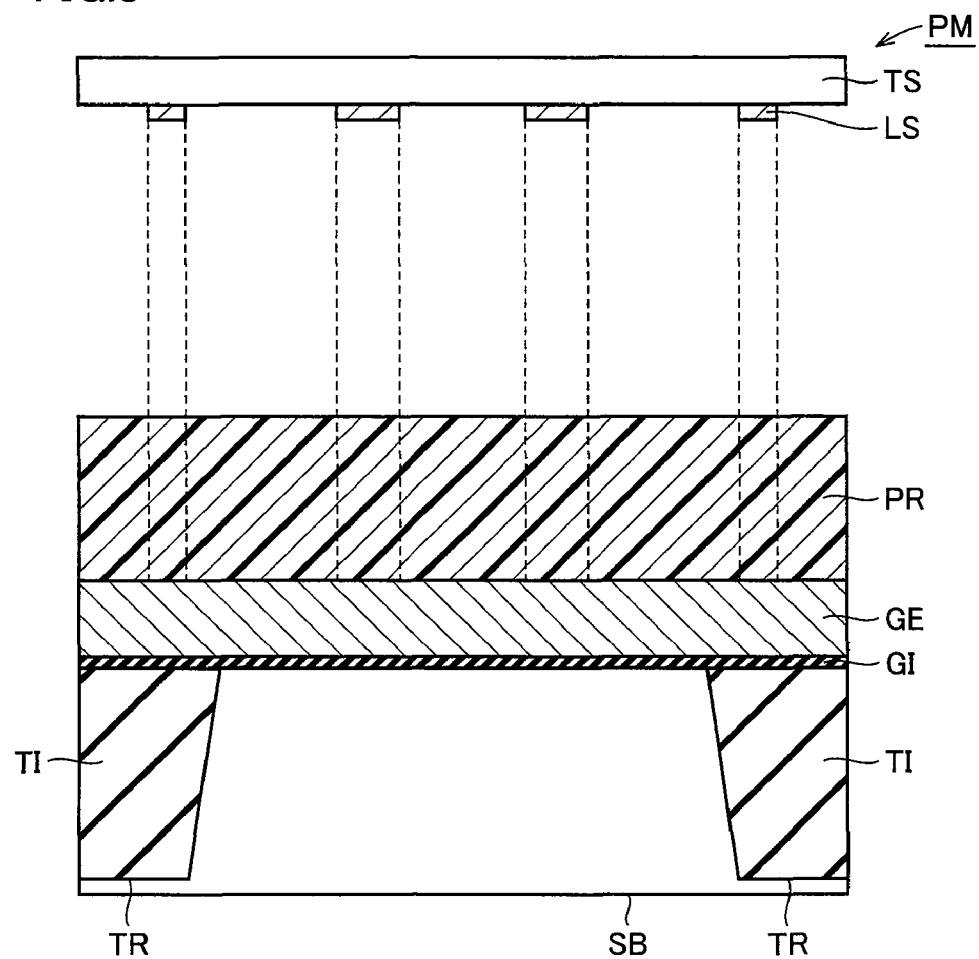

Referring to FIG. 8, a gate insulator GI and a gate electrode conductive layer GE are formed on the main surface of semiconductor substrate SB. A positive photoresist PR is applied onto gate electrode conductive layer GE.

A pattern of a photomask PM is exposed to photoresist PR. Photomask PM includes a substrate TS that transmits exposure light and light shielding pattern (for example, chromium film) LS that blocks the transmission of the exposure light. After the exposure, photoresist PR is developed.

Figure 9:
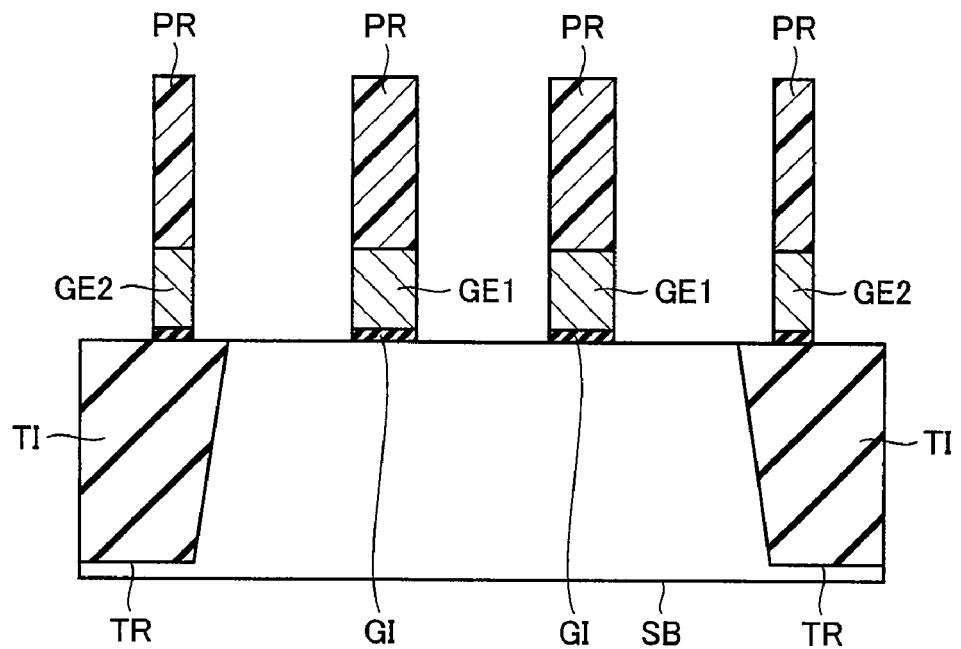

Referring to FIG. 9, the region of photoresist PR irradiated with the exposure light is removed to perform the patterning of photoresist PR by the development. Etching is performed to gate electrode conductive layer GE with the pattern of photoresist PR as a mask. Therefore, the patterning of the gate electrode conductive layer is performed to form gate electrode layers GE1 to GE4. Then the pattern of photoresist PR is removed by ashing.

Figure 10:
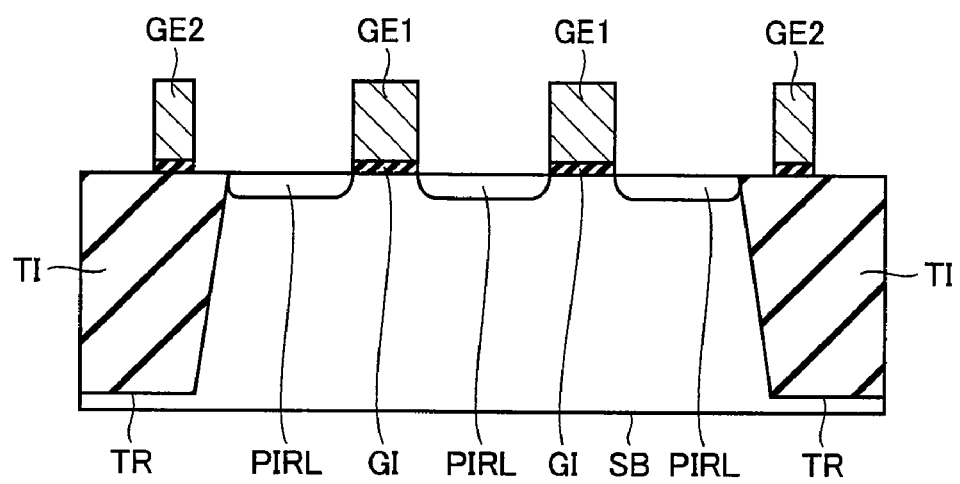

Referring to FIG. 10, an impurity is ion-implanted with gate electrode layers GE1 to GE4 as the mask, thereby forming a low-concentration region of the source/drain region in the main surface of semiconductor substrate SB. At this point, an n-type impurity and a p-type impurity are separately implanted to form an n-type low-concentration region and a p-type low-concentration region PIRL.

Figure 11:
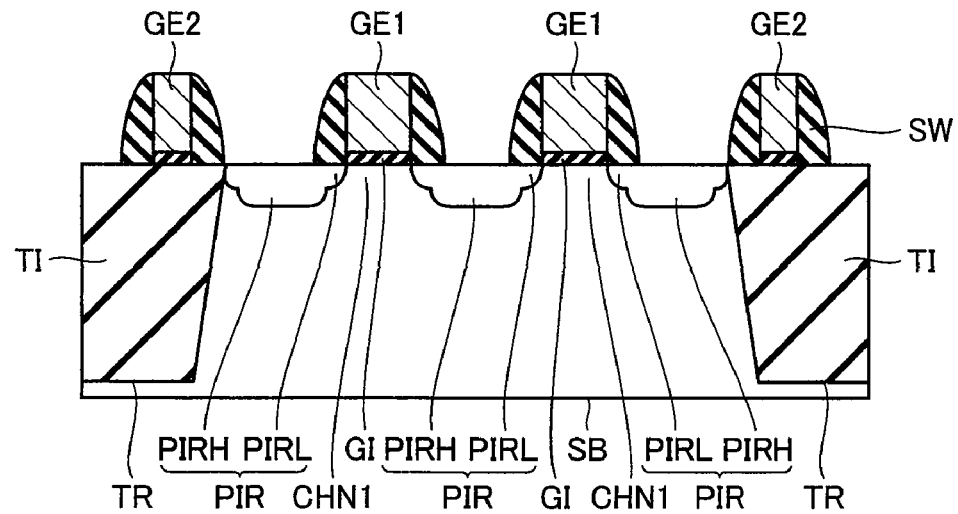

Referring to FIG. 11, a sidewall spacer insulator is formed such that gate electrode layers GE1 to GE4 are covered therewith. The sidewall spacer insulator is made of only a silicon oxide, or a silicon nitride is formed after the silicon oxide is formed. Then whole surface etch back is performed until the main surface of semiconductor substrate SB is exposed, whereby a sidewall spacer SW is formed while the sidewall spacer insulator remains in each sidewall of gate electrode layers GE1 to GE4.

The impurity is ion-implanted with sidewall spacer SW and gate electrode layers GE1 to GE4 as the mask, thereby forming a high-concentration region of the source/drain region in the main surface of semiconductor substrate SB. At this point, the n-type impurity and the p-type impurity are separately implanted to form an n-type high-concentration region and a p-type high-concentration region PIRH.

Thus, n-type source/drain region NIR having an LDD (Lightly Doped Drain) structure is formed by n-type low-concentration region and high-concentration region. In addition, p-type source/drain region PIR having the LDD structure is formed by p-type low-concentration region PIRL and p-type high-concentration region PIRH.

Figure 12:
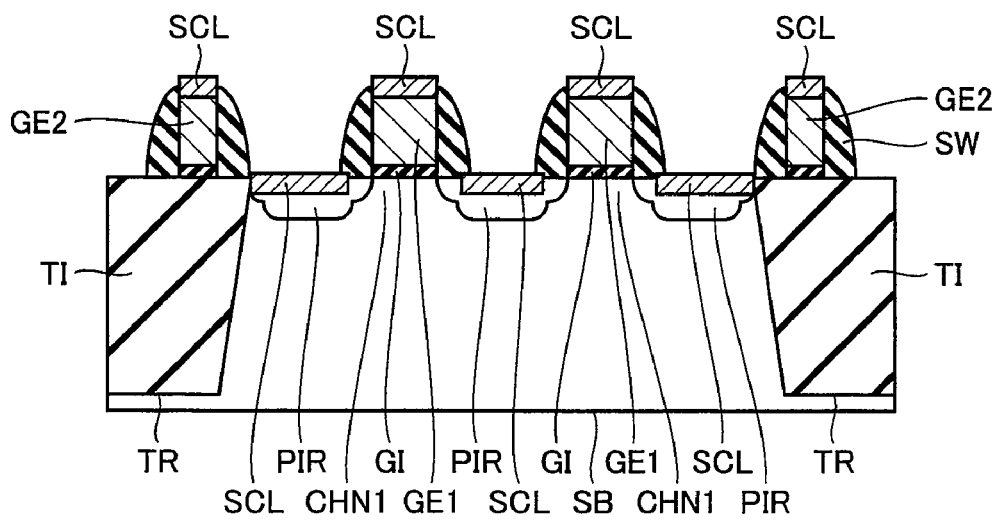

Referring to FIG. 12, a refractory metal layer is formed over the main surface of semiconductor substrate SB, and a heat treatment is performed to form a silicide layer SCL on gate electrode layers GE1 to GE4 and the main surface of semiconductor substrate SB. Then a portion that does not become the silicide is removed in the refractory metal layer. The refractory metal material can be selected from Ni, Co, Pt, Pd, Hf, V, Er, Ir, and Yb or a combination of at least two elements thereof.

Figure 13:
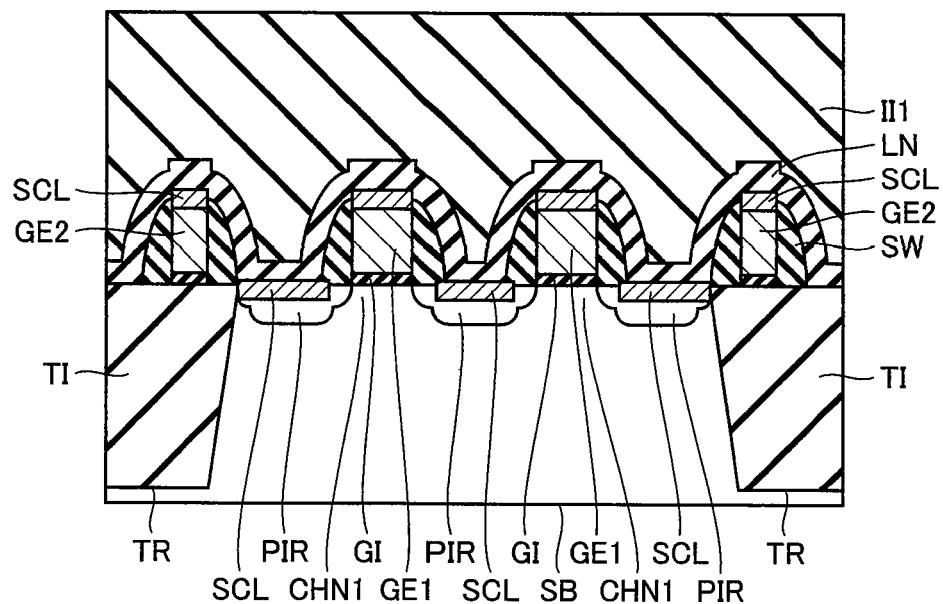

Referring to FIG. 13, liner nitride film LN and inter-layer insulator II1 made of the silicon oxide are sequentially laminated on the main surface of semiconductor substrate SB such that gate electrode layers GE1 to GE4 and sidewall spacer SW are covered therewith.

Figure 14:
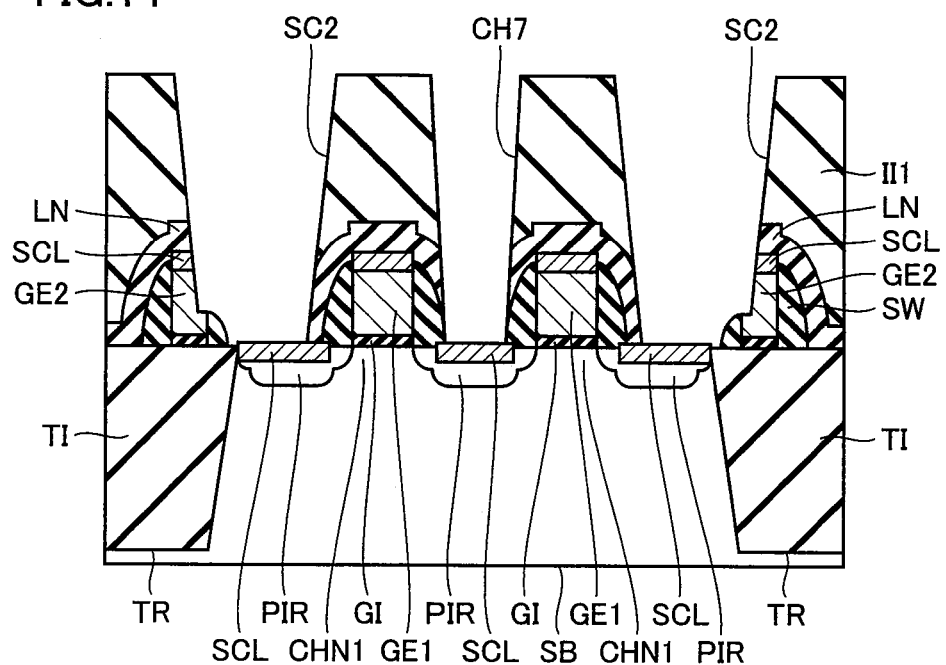

Referring to FIG. 14, shared contact holes SC1 and SC2 and contact holes CH1 to CH10 are made in liner nitride film LN and inter-layer insulator II1 by a photoengraving process and the etching technique.

At this point, shared contact hole SC1 is made so as to reach both gate electrode layer GE1 of load transistor LT1 and drain region PIR of load transistor LT2 (such that both the surface are exposed). Shared contact hole SC2 is made so as to reach both gate electrode layer GE2 of load transistor LT2 and drain region PIR of load transistor LT1 (such that both the surface are exposed).

Figure 15:
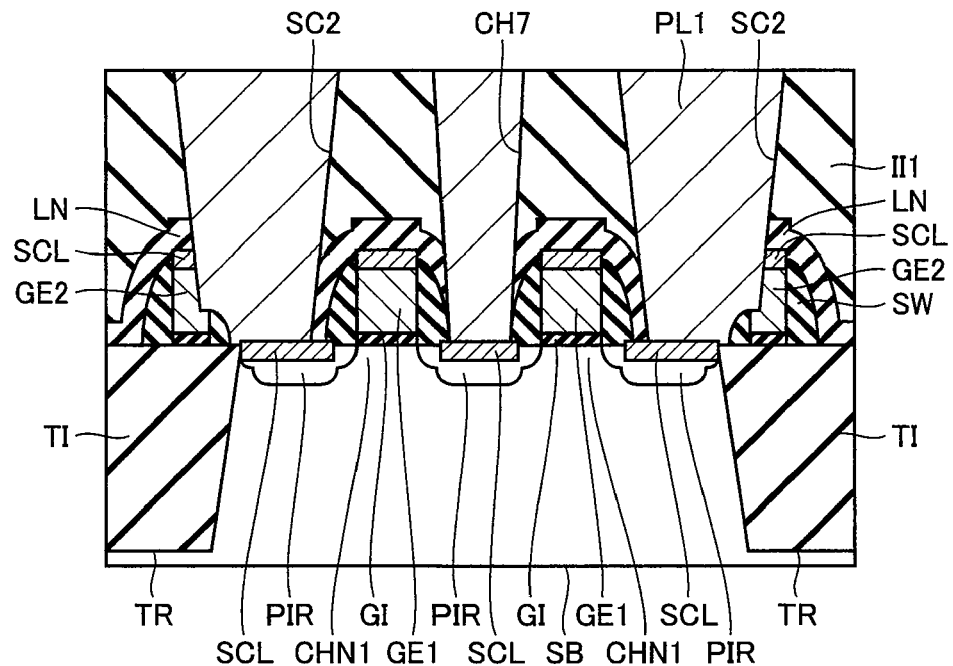

Referring to FIG. 15, a conductive layer made of tungsten (W) is formed on inter-layer insulator II1 so as to embed shared contact holes SC1 and SC2 and contact holes CH1 to CH10 by a CVD (Chemical Vapor Deposition) method or the like. Then the etch back is performed to the conductive layer until the surface of inter-layer insulator II1 is exposed, thereby forming conductive layer PL1 as a contact plug layer that embeds shared contact holes SC1 and SC2 and contact holes CH1 to CH10.

Then the formation of the insulator and the formation of the conductive layer are repeated to produce the semiconductor device of the first embodiment as shown in FIG. 5.

A configuration of the photomask shown in FIG. 8 will be described below.

Figure 16:
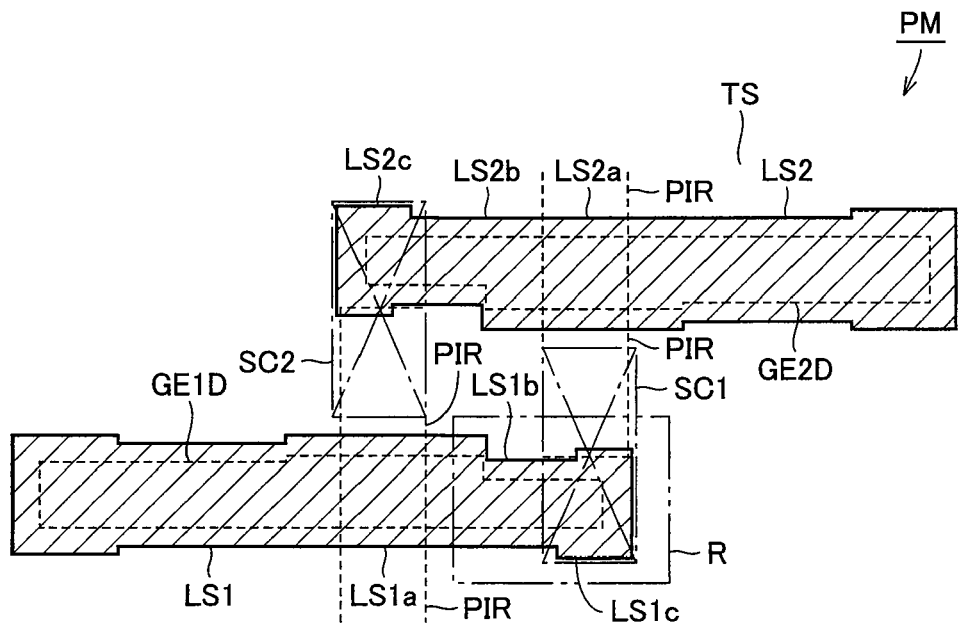
FIG. 16 is a plan view schematically showing a configuration of a photomask used in the method for producing the semiconductor device of the first embodiment.

Mainly referring to FIG. 16, in photomask PM used to perform the patterning of the gate electrode layer by the exposure of the positive photoresist, a light shielding pattern LS is formed such that light shielding portions LS1 and LS2 are located at a position corresponding to the gate electrode pattern. In the case of the positive photoresist, dimensions of the light shielding portion are set slightly larger than design values of the gate electrode layer. Therefore, dimensions of light shielding portion LS1 and LS2 of light shielding pattern LS are set larger than design values GE1D and GE2D of the gate electrode layer. Because diffraction of the exposure light is particularly increased at each end of light shielding portions LS1 and LS2, an amount of enlarged pattern size with respect to design values GE1D and GE2D of the gate electrode layer is much increased at ends (third pattern portion) LS1c and LS2c of light shielding portions LS1 and LS2 than other portions.

In the first embodiment, light shielding portion LS1 includes a first pattern portion LS1a, a second pattern portion LS1b, and third pattern portion LS1c. First pattern portion LS1a corresponds to the portion of gate electrode layer GE1 formed on channel formation region CHN1 of load transistor LT1. Third pattern portion LS1c corresponds to the portion of the end on the side of shared contact hole SC1 of gate electrode layer GE1. Second pattern portion LS1b corresponds to the portion of gate electrode layer GE1 sandwiched between first pattern portion LS1a and third pattern portion LS1c, and second pattern portion LS1b corresponds to the portion in which the notch of gate electrode layer GE1 is formed.

Figure 17:
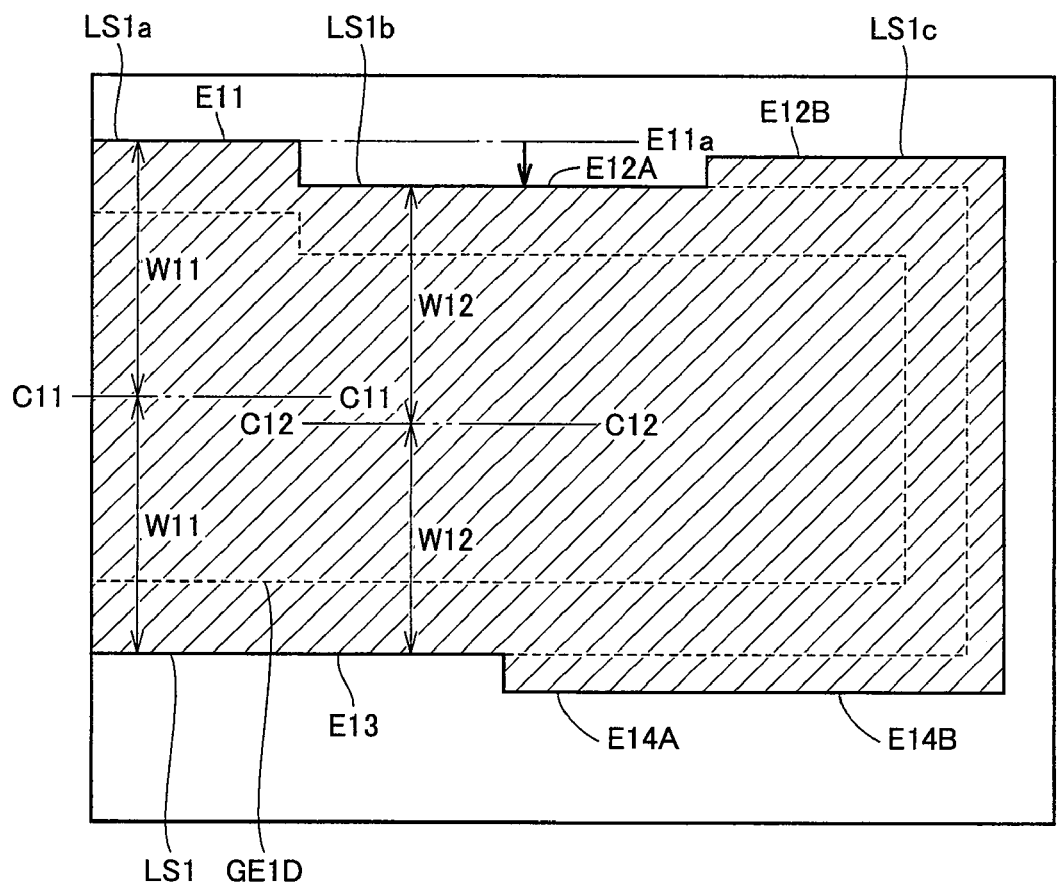
FIG. 17 is a partially enlarged plan view showing a region R of FIG. 16.

Mainly referring to FIG. 17, light shielding portion LS1 includes sidewalls E11, E12A, and E12B and sidewalls E13, E14A, and E14B. In the planar view, sidewall E11 and sidewall E13 are located opposite to each other, sidewall E12A and sidewall E14A are located opposite to each other, and sidewall E12B and sidewall E14B are located opposite to each other. In the planar view, sidewall E12A of second pattern portion LS1*b* is shifted toward the sides of sidewalls E13, E14A, and E14B of light shielding portion LS1 from a virtual extended line E11*a* of sidewall E11 of first pattern portion LS1*a*. In the planar view, a center line (line C12-C12) of a line width (2×W12) of second pattern portion LS1*b* is shifted toward the sides of sidewalls E13, E14A, and E14B from a center line (line C11-C11) of a line width (2×W11) of first pattern portion LS1*a*.

Sidewall E12A is located on the sides of sidewalls E13, E14A, and E14B from sidewall E12B of third pattern portion LS1*c*.

In the first embodiment, as shown in FIG. 6, in the planar view, sidewall E2 of gate electrode layer GE1 is located on the side of sidewall E3 from virtual extended line E1*a* of sidewall E1. Therefore, the generation of the opening defect can be suppressed in forming shared contact hole SC1. The reason why the generation of the opening defect is suppressed will be described below.

Figure 18:
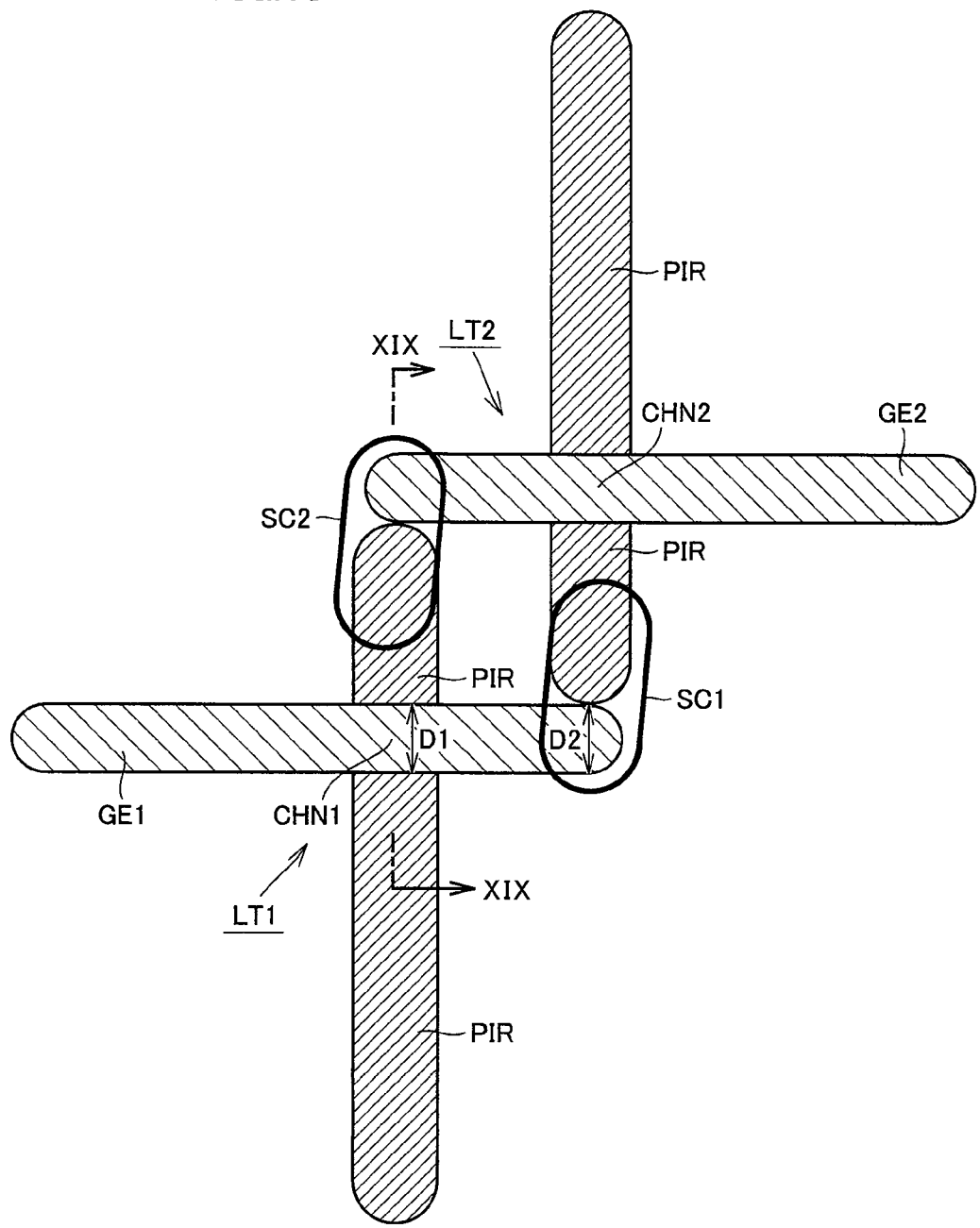
FIG. 18 is a plan view schematically showing the case in which supposedly a gate electrode layer is linearly extended while having no notch.
Figure 19:
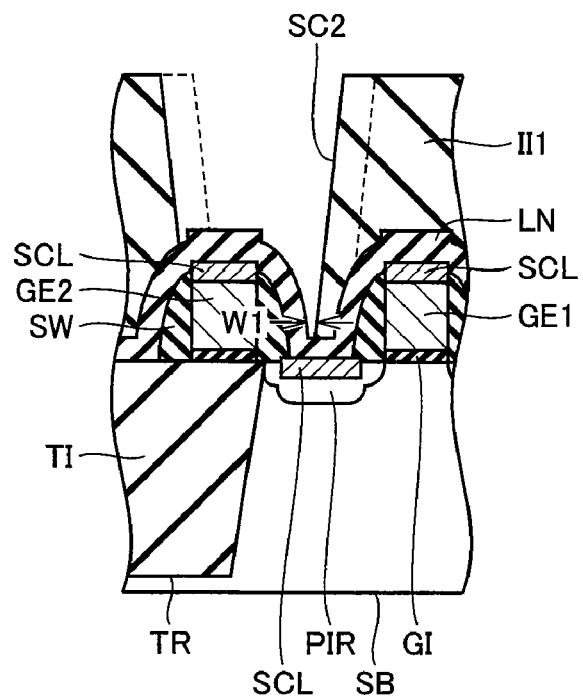
FIG. 19 is a schematic sectional view for explaining that an opening defect is generated in producing a structure of FIG. 18.

As shown in FIG. 18, it is assumed that gate electrode layers GE1 and GE2 are linearly extended with no notch. FIG. 19 shows a schematic section taken on a line XIX-XIX of FIG. 18 in the middle of making the shared contact hole. Referring to FIG. 19, usually the shared contact hole has a tapered shape in section in which an opening diameter is decreased at a deeper position from the opening end. Therefore, when shared contact hole SC2 pierces through inter-layer insulator II1 to reach liner nitride film LN, an etching area of liner nitride film LN exposed at the bottom of shared contact hole SC2 is also reduced.

The projection of sidewall spacer SW located in the sidewall of gate electrode layer GE1 exists in the etching for making shared contact hole SC2, thereby decreasing a distance W1 between a lower end of liner nitride film LN along sidewall spacer SW and a lower end of an edge portion in a long-side direction of shared contact hole SC2.

Distance W1 is further decreased when the position at which shared contact hole SC2 is made is shifted to a position shown by a solid line from a position shown by a dotted line in FIG. 19 due to a mask alignment error.

In the case where distance W1 is decreased, the residue of inter-layer insulator II1 is generated in the portion of distance W1 by a micro-loading effect. In this state, when liner nitride film LN is etched, the opening defect is generated.

Figure 20:
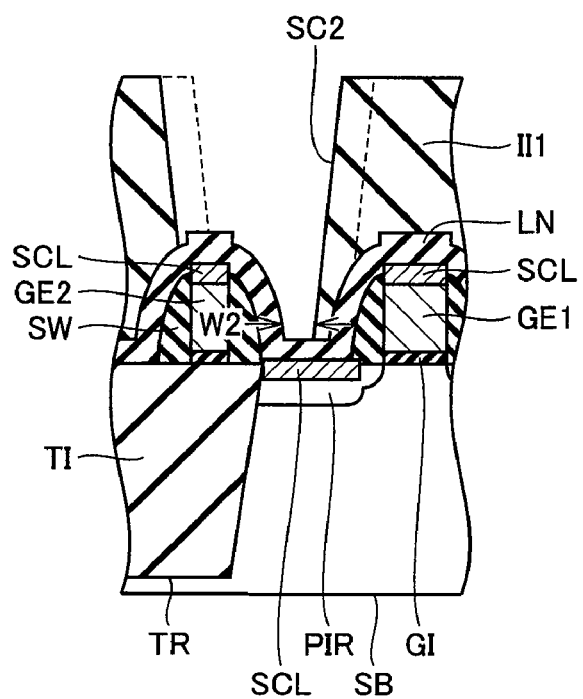
FIG. 20 is a schematic sectional view for explaining that the generation of the opening defect can be suppressed in producing the semiconductor device of the first embodiment.

On the other hand, in the first embodiment, as shown in FIG. 6, in the portion that shared contact hole SC1 of gate electrode layer GE1 reaches, in the planar view, sidewall E2 is retreated toward the side of sidewall E3 with respect to virtual extended line E1*a* of sidewall E1. The same holds true for the portion that shared contact hole SC2 of gate electrode layer GE2 reaches. Therefore, as shown in FIG. 20, a distance W2 between the lower end of liner nitride film LN along sidewall spacer SW and the lower end of the edge portion in the long-side direction of shared contact hole SC2 can be much increased compared with the case shown in FIG. 19. Accordingly, the residue is hardly generated in the portion of distance W2, so that the generation of the opening defect can be suppressed in making shared contact hole SC1.

For shared contact hole SC2, similarly the generation of the opening defect can be suppressed.

Second Embodiment

Figure 21:
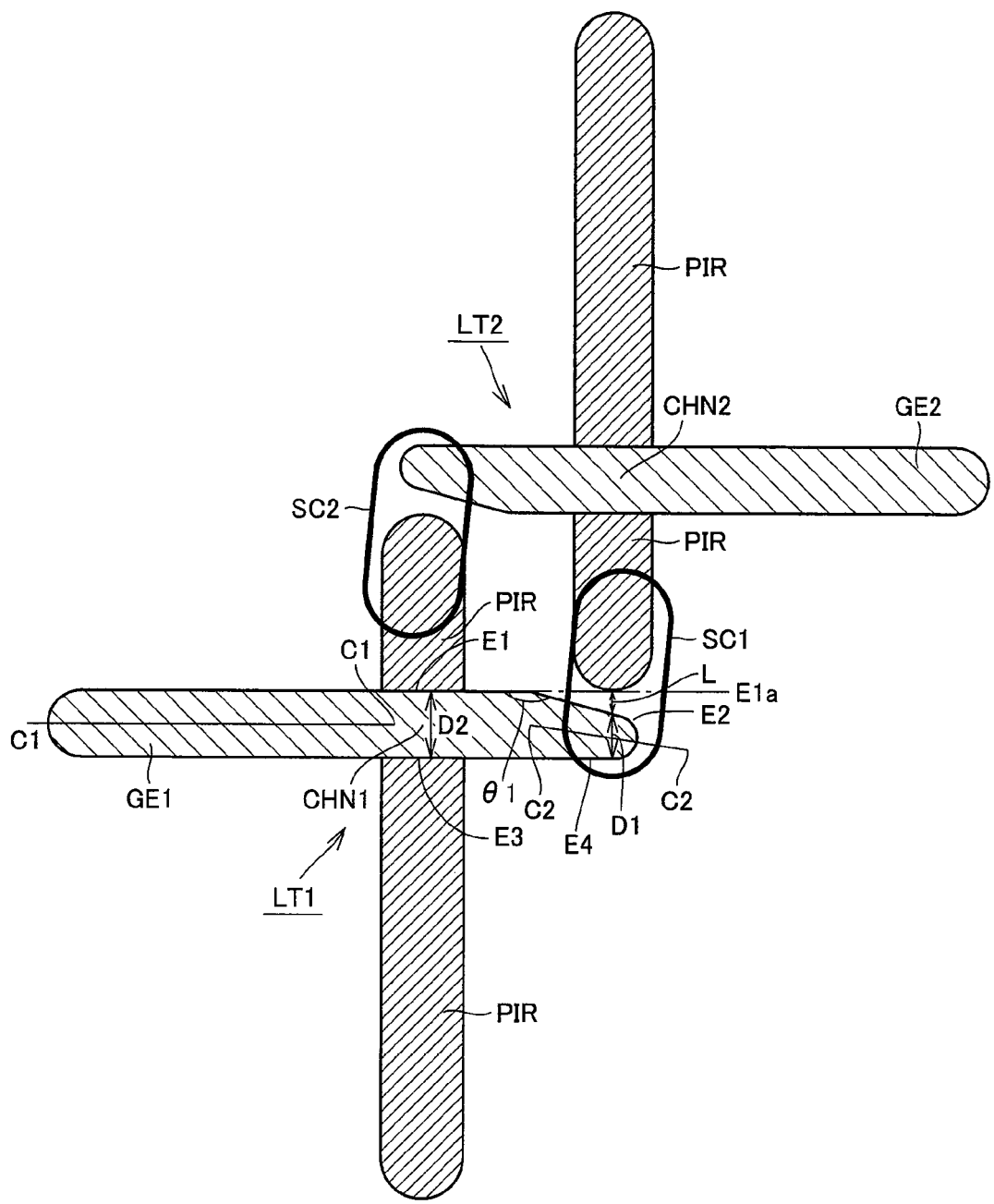
FIG. 21 is an enlarged plan view schematically showing a neighborhood of a shared contact hole in a semiconductor device according to a second embodiment of the invention.

Referring to FIG. 21, a configuration of a second embodiment differs from the configuration of the first embodiment in that sidewall E2 is intersected with sidewall E1 while inclined relative to sidewall E1. Specifically, sidewall E2 is inclined so as to be retreated toward the side of sidewall E4 with respect to virtual extended line E1*a* of sidewall E1 as sidewall E2 is away from channel formation region CHN1, and sidewall E2 is intersected with virtual extended line E1*a* of sidewall E1 at an angle θ1.

In the planar view, the center line (line C2-C2) of line width D1 in the portion that shared contact hole SC1 of gate electrode layer GE1 reaches is shifted toward the side of sidewall E4 with respect to the center line (line C1-C1) of line width D2 in the portion located on channel formation region CHN1 of gate electrode layer GE1. The center line (line C2-C2) of line width D1 is inclined relative to the center line (line C1-C1) of line width D2. Line width D1 and line width D2 are defined by sidewall E1, sidewall E3, and the line width in the perpendicular direction.

The position shift of sidewall E2 with respect to virtual extended line E1*a* of sidewall E1 is generated by providing a notch in the portion that shared contact hole SC1 of gate electrode layer GE1 reaches. That is, in the planar view, the portion that shared contact hole SC1 of gate electrode layer GE1 reaches has the notch such that sidewall E2 is retreated and inclined toward the side of sidewall E3 with respect to virtual extended line E1*a* of sidewall E1.

Sidewall E4 in the portion that shared contact hole SC1 of gate electrode layer GE1 reaches and sidewall E3 in the portion located on channel formation region CHN1 of gate electrode layer GE1 are substantially located on the same straight line. In the planar view, preferably shortest distance L between sidewall E2 and the end of drain region (p-type impurity region) PIR of load transistor LT2 is not lower than 5 nm.

Gate electrode layer GE2 has a configuration similar to that of gate electrode layer GE1.

Because other configurations of the second embodiment are substantially identical to those of the first embodiment, the same component is designated by the same numeral, and the overlapping description is not repeated.

The configuration of the photomask used to form the gate electrode layer will be described below.

Figure 22:
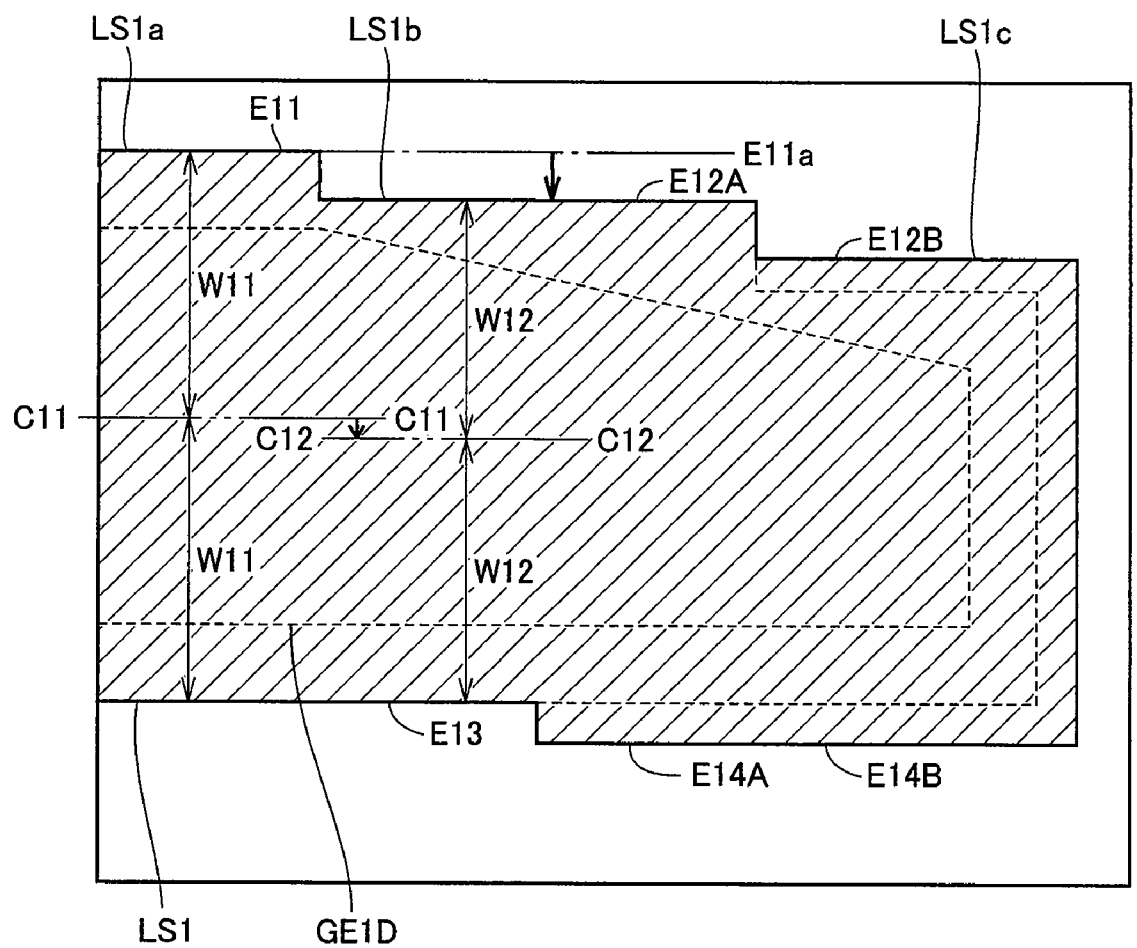
FIG. 22 is a partially enlarged plan view schematically showing a configuration of a photomask used to produce the semiconductor device of the second embodiment.

Referring to FIG. 22, light shielding portion LS1 of the photomask of the second embodiment has sidewalls E11, E12A, and E12B and sidewalls E13, E14A, and E14B. In the planar view, sidewalls E11, E12A, and E12B and sidewalls E13, E14A, and E14B are located opposite to each other. In the planar view, sidewall E12A of second pattern portion LS1*b* is shifted toward the sides of sidewalls E13, E14A, and E14B from virtual extended line E11*a* of sidewall E11 of first pattern portion LS1*a*. In the planar view, the center line (line C12-C12) of the line width (2×W12) of second pattern portion LS1*b* is shifted toward the sides of sidewalls E13, E14A, and E14B with respect to the center line (line C11-C11) of the line width (2×W11) of first pattern portion LS1*a*.

Sidewall E12B of third pattern portion LS1*c* located on a leading end side of light shielding portion LS1 with respect to sidewall E12A is further retreated toward the sides of sidewalls E13, E14A, and E14B from sidewall E12A of second pattern portion LS1*b*.

Because other configurations of the second embodiment are substantially identical to those of the first embodiment, the same component is designated by the same numeral, and the overlapping description is not repeated.

According to the second embodiment, as shown in FIG. 21, in the portion that shared contact hole SC1 of gate electrode layer GE1 reaches, sidewall E2 is retreated toward the side of sidewall E3 with respect to virtual extended line E1*a* of sidewall E1 in the planar view. Therefore, similarly to the first embodiment, the generation of the opening defect can be suppressed in forming shared contact hole SC1.

Similarly the generation of the opening defect can be suppressed for shared contact hole SC2.

Third Embodiment

In the first and second embodiments, sidewall E4 in the portion that shared contact hole SC1 (or SC2) of gate electrode layer GE1 (or GE2) reaches and sidewall E3 in the portion located on channel formation region CHN1 (or CHN2) of gate electrode layer GE1 (or GE2) are located on the same straight line. Moreover, the present invention can also be applied to the case in which sidewall E4 and sidewall E3 are located on different straight lines. Therefore, third and fourth embodiments will be described for the case in which sidewall E4 and sidewall E3 are located on different straight lines.

Figure 23:
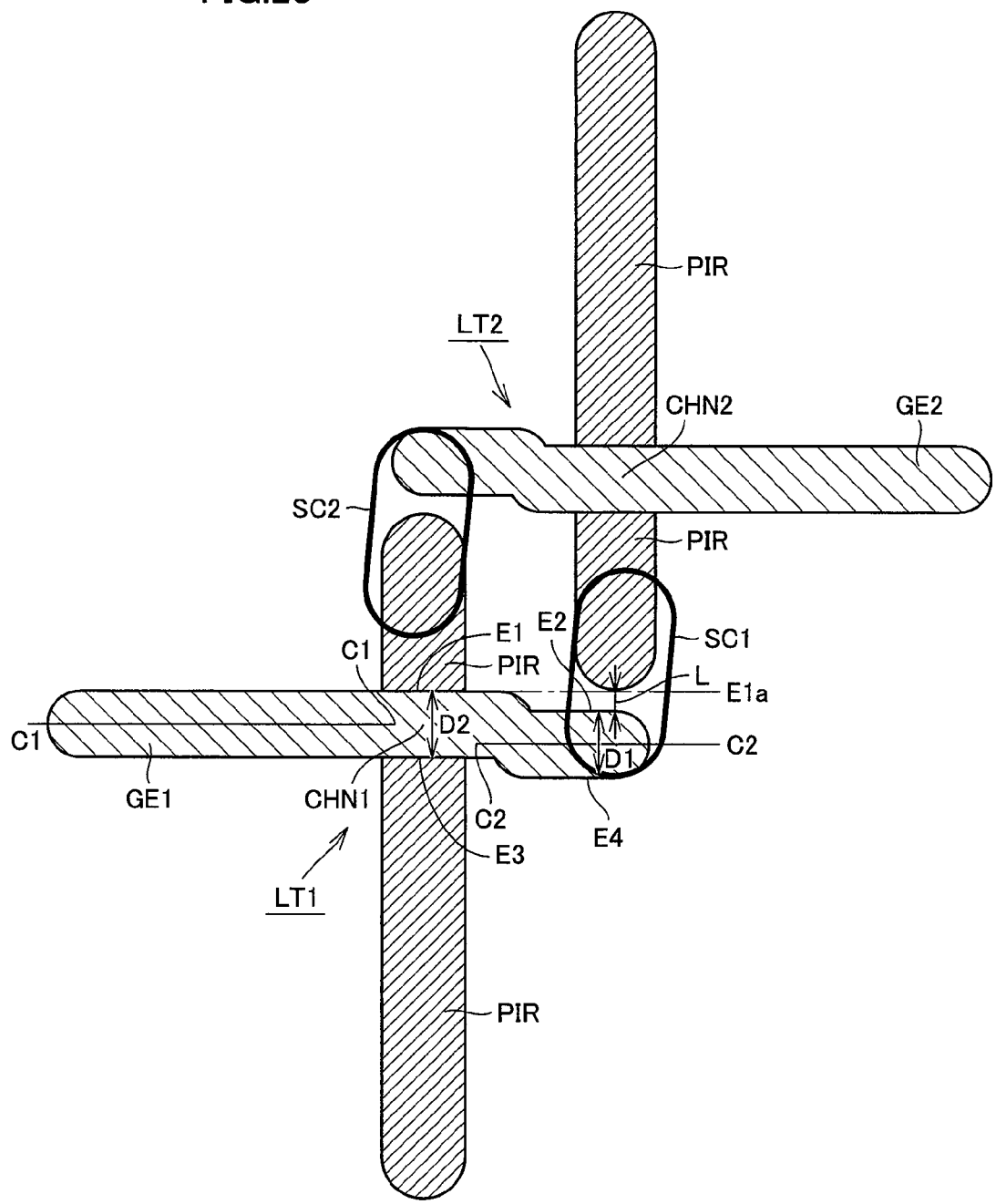
FIG. 23 is an enlarged plan view schematically showing a neighborhood of a shared contact hole in a semiconductor device according to a third embodiment of the invention.

Referring to FIG. 23, a configuration of the third embodiment differs from the configuration of the first embodiment in that sidewall E4 is located on a straight line different from that of sidewall E3.

In the third embodiment, sidewall E4 in the portion that shared contact hole SC1 of gate electrode layer GE1 reaches is substantially extended in parallel with sidewall E3 in the portion located on channel formation region CHN1 of gate electrode layer GE1, and sidewall E4 is shifted toward the opposite side to sidewall E2 with respect to sidewall E3. Line width D1 in the portion that shared contact hole SC1 of gate electrode layer GE1 reaches may be equal to or different from line width D2 in the portion located on channel formation region CHN1 of gate electrode layer GE1. Line width D1 and line width D2 are defined by sidewall E1, sidewall E3, and the line width in the perpendicular direction.

Gate electrode layer GE2 has a configuration similar to that of gate electrode layer GE1.

Because other configurations of the third embodiment are substantially identical to those of the first embodiment, the same component is designated by the same numeral, and the overlapping description is not repeated.

The configuration of the photomask used to form the gate electrode layer will be described below.

Figure 24:
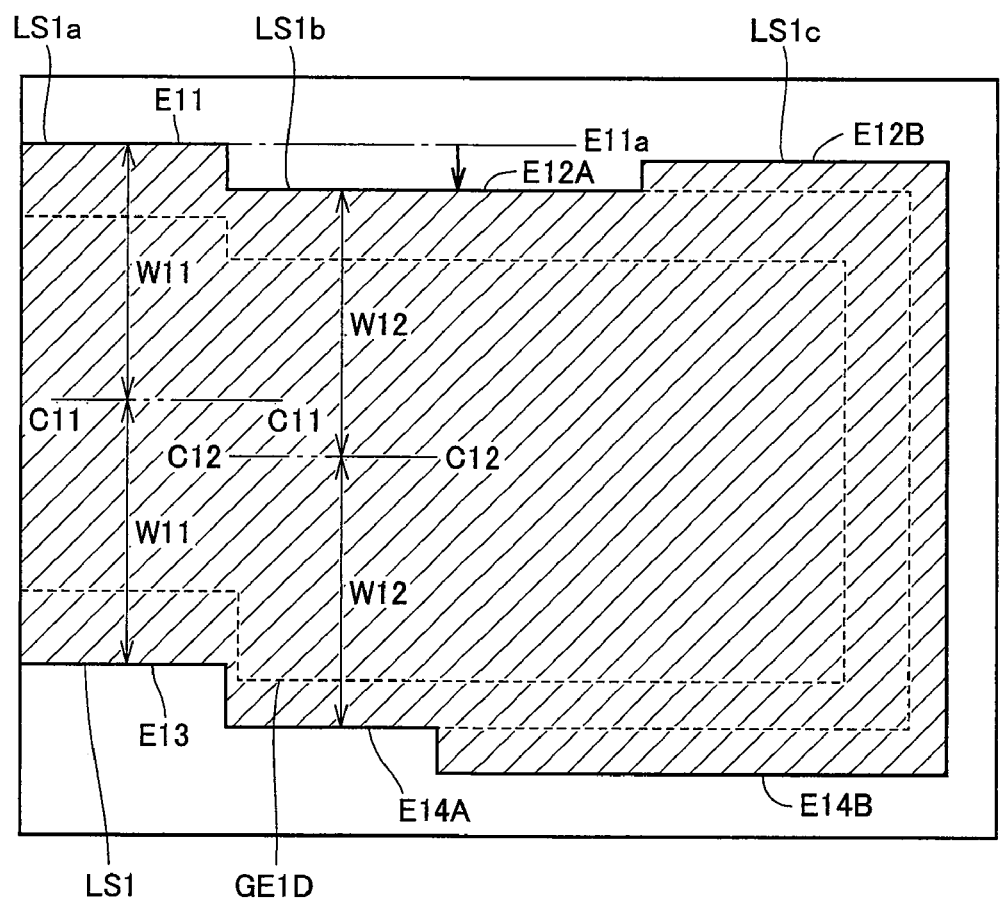
FIG. 24 is a partially enlarged plan view schematically showing a configuration of a photomask used to produce the semiconductor device of the third embodiment.

Referring to FIG. 24, light shielding portion LS1 of the photomask of the third embodiment has sidewalls E11, E12A, and E12B and sidewalls E13, E14A, and E14B. In the planar view, sidewalls E11, E12A, and E12B and sidewalls E13, E14A, and E14B are located opposite to each other. In the planar view, sidewall E12A of second pattern portion LS1$b$ is shifted toward the side of sidewall E13 of light shielding portion LS1 from virtual extended line E11$a$ of sidewall E11 of first pattern portion LS1$a$. In the planar view, the center line (line C12-C12) of the line width (2×W12) of second pattern portion LS1$b$ is shifted toward the side of sidewall E13 with respect to the center line (line C11-C11) of the line width (2×W11) of first pattern portion LS1$a$.

Sidewall E12A of second pattern portion LS1$b$ is retreated toward the sides of sidewalls E14A and E14B with respect to sidewall E12B of third pattern portion LS1$c$ that is located on the leading end side of light shielding portion LS1 with respect to the sidewall E12A.

Sidewall E14A is shifted toward the opposite side to sidewall E12A with respect to sidewall E13. Sidewall E14B is shifted toward the opposite side to sidewalls E12A and E12B with respect to sidewall E14A.

Because other configurations of the third embodiment are substantially identical to those of the first embodiment, the same component is designated by the same numeral, and the overlapping description is not repeated.

According to the third embodiment, as shown in FIG. 23, in the portion that shared contact hole SC1 of gate electrode layer GE1 reaches, sidewall E2 is retreated toward the side of sidewall E3 with respect to virtual extended line E1$a$ of sidewall E1 in the planar view. Therefore, similarly to the first embodiment, the generation of the opening defect can be suppressed in forming shared contact hole SC1.

Similarly the generation of the opening defect can be suppressed for shared contact hole SC2.

Fourth Embodiment

Figure 25:
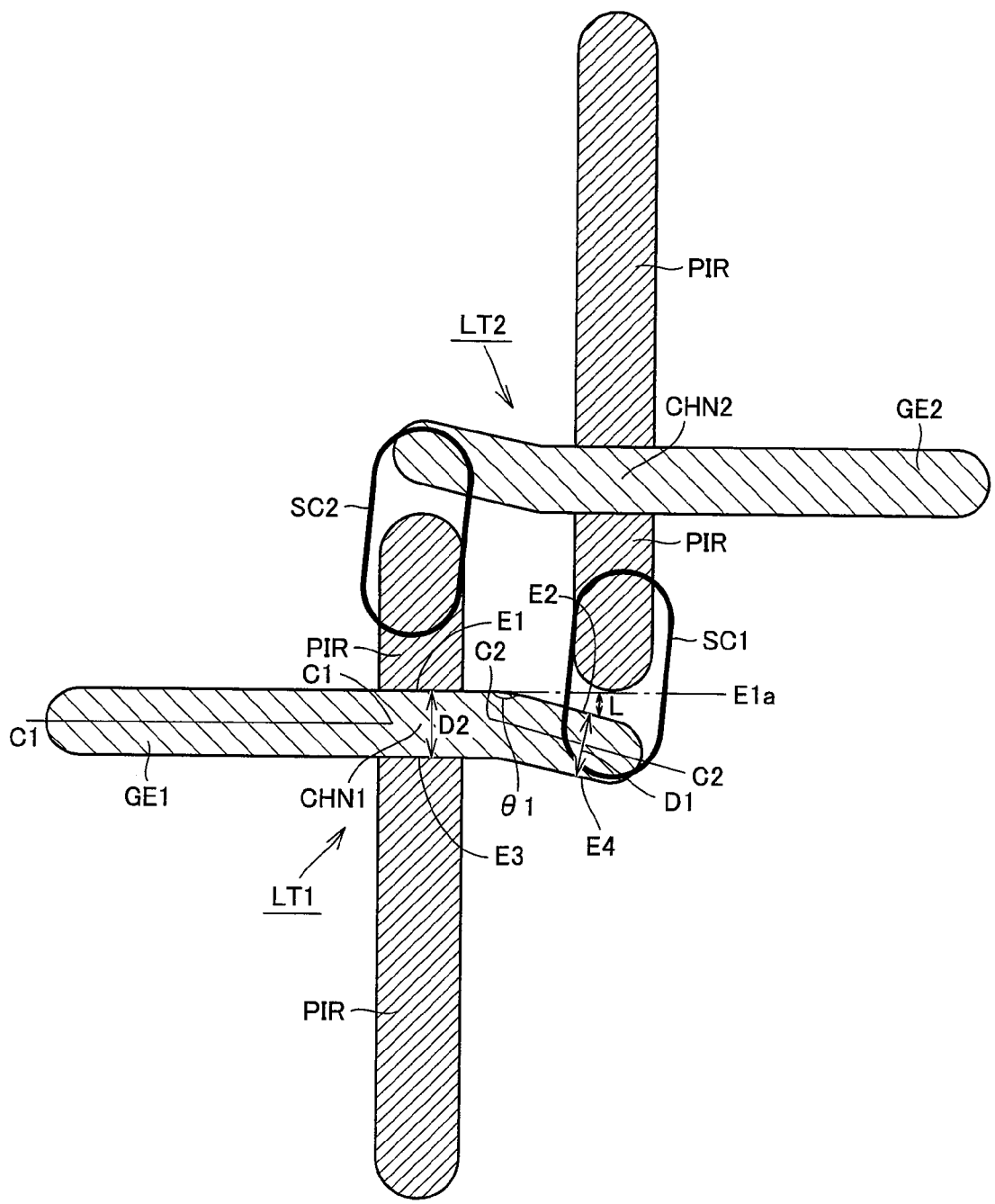
FIG. 25 is an enlarged plan view schematically showing a neighborhood of a shared contact hole in a semiconductor device according to a fourth embodiment of the invention.

Referring to FIG. 25, a configuration of the fourth embodiment differs from the configuration of the second embodiment in that sidewall E4 is located on a straight line different from that of sidewall E3 and in that sidewall E2 and sidewall E4 are respectively inclined relative to sidewall E1 and sidewall E3.

In the fourth embodiment, sidewall E2 in the portion that shared contact hole SC1 of gate electrode layer GE1 reaches is inclined so as to be retreated toward the side of sidewall E4 with respect to sidewall E1 in the portion located on channel formation region CHN1 of gate electrode layer GE1 as sidewall E2 is away from channel formation region CHN1.

Sidewall E4 in the portion that shared contact hole SC1 of gate electrode layer GE1 reaches is inclined so as to be retreated toward the opposite side to sidewall E2 with respect to sidewall E3 in the portion located on channel formation region CHN1 of gate electrode layer GE1 as sidewall E4 is away from channel formation region CHN1. Line width D1 in the portion that shared contact hole SC1 of gate electrode layer GE1 reaches may be equal to or different from line width D2 in the portion located on channel formation region CHN1 of gate electrode layer GE1. Line width D2 is defined by sidewall E1, sidewall E3, and the line width in the perpendicular direction. Line width D1 is defined by sidewall E2, sidewall E4, and the line width in the perpendicular direction.

Gate electrode layer GE2 has a configuration similar to that of gate electrode layer GE1.

Because other configurations of the fourth embodiment are substantially identical to those of the second embodiment, the same component is designated by the same numeral, and the overlapping description is not repeated.

The configuration of the photomask used to form the gate electrode layer will be described below.

Figure 26:
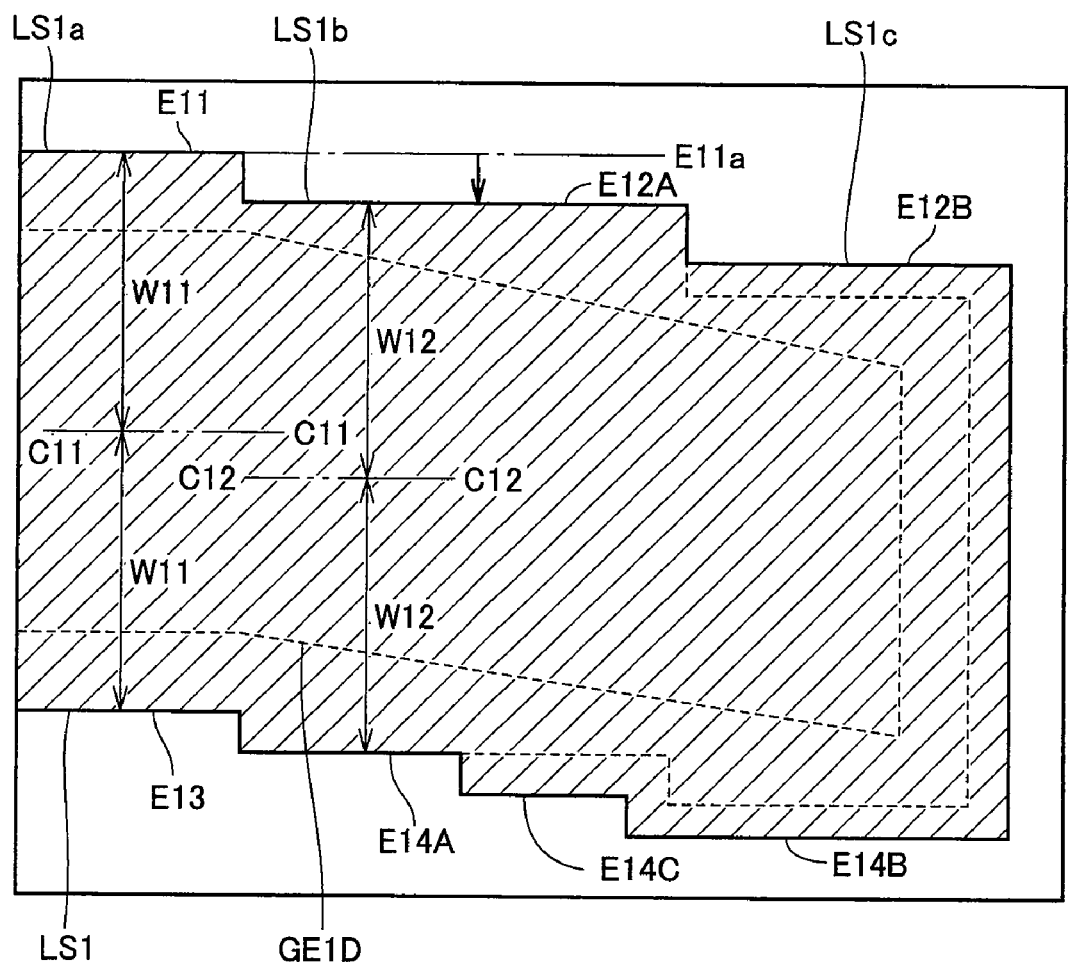
FIG. 26 is a partially enlarged plan view schematically showing a configuration of a photomask used to produce the semiconductor device of the fourth embodiment.

Referring to FIG. 26, light shielding portion LS1 of the photomask of the fourth embodiment has sidewalls E11, E12A, and E12B and sidewall E13 and E14A to E14C. In the planar view, sidewalls E11, E12A, and E12B and sidewalls E13 and E14A to E14C are located opposite to each other. In the planar view, sidewall E12A of second pattern portion LS1$b$ is shifted toward the side of sidewall E13 of light shielding portion LS1 from virtual extended line E11$a$ of sidewall E11 of first pattern portion LS1$a$. In the planar view, the center line (line C12-C12) of the line width (2×W12) of second pattern portion LS1$b$ is shifted toward the side of sidewall E13 with respect to the center line (line C11-C11) of the line width (2×W11) of first pattern portion LS1$a$.

Sidewall E12B that is located on the leading end side of light shielding portion LS1 with respect to the sidewall E12A is retreated toward the side of sidewalls E13 with respect to sidewall E12A of second pattern portion LS1$b$.

Sidewall E14A is shifted toward the opposite side to sidewall E12A with respect to sidewall E13. Sidewall E14C is shifted toward the opposite side to sidewalls E12A with respect to sidewall E14A. Sidewall E14B is shifted toward the opposite side to sidewall E12A with respect to sidewall E14C.

Because other configurations of the fourth embodiment are substantially identical to those of the second embodiment, the same component is designated by the same numeral, and the overlapping description is not repeated.

According to the fourth embodiment, as shown in FIG. 25, in the portion that shared contact hole SC1 of gate electrode layer GE1 reaches, sidewall E2 is retreated toward the side of sidewall E3 with respect to virtual extended line E1a of sidewall E1 in the planar view. Therefore, similarly to the first embodiment, the generation of the opening defect can be suppressed in forming shared contact hole SC1.

Similarly the generation of the opening defect can be suppressed for shared contact hole SC2.

In the fourth embodiment, the shared contact hole reaches both the gate electrode layer of one of the load transistors and the drain region of the other load transistor. Alternatively, the shared contact hole may reach both a gate electrode layer of another transistor and another impurity region.

In the embodiments, SRAM is described as the device having shared contact hole by way of example. However, the present invention can be applied to other devices except for SRAM as long as the device has the shared contact hole.

In the embodiments, SRAM is formed by the MOS transistors. The present invention is not limited to the MOS transistor, but can be applied to insulated gate field effect transistors.

(Arrangement of Plural SRAM Memory Cells)

Figure 27:
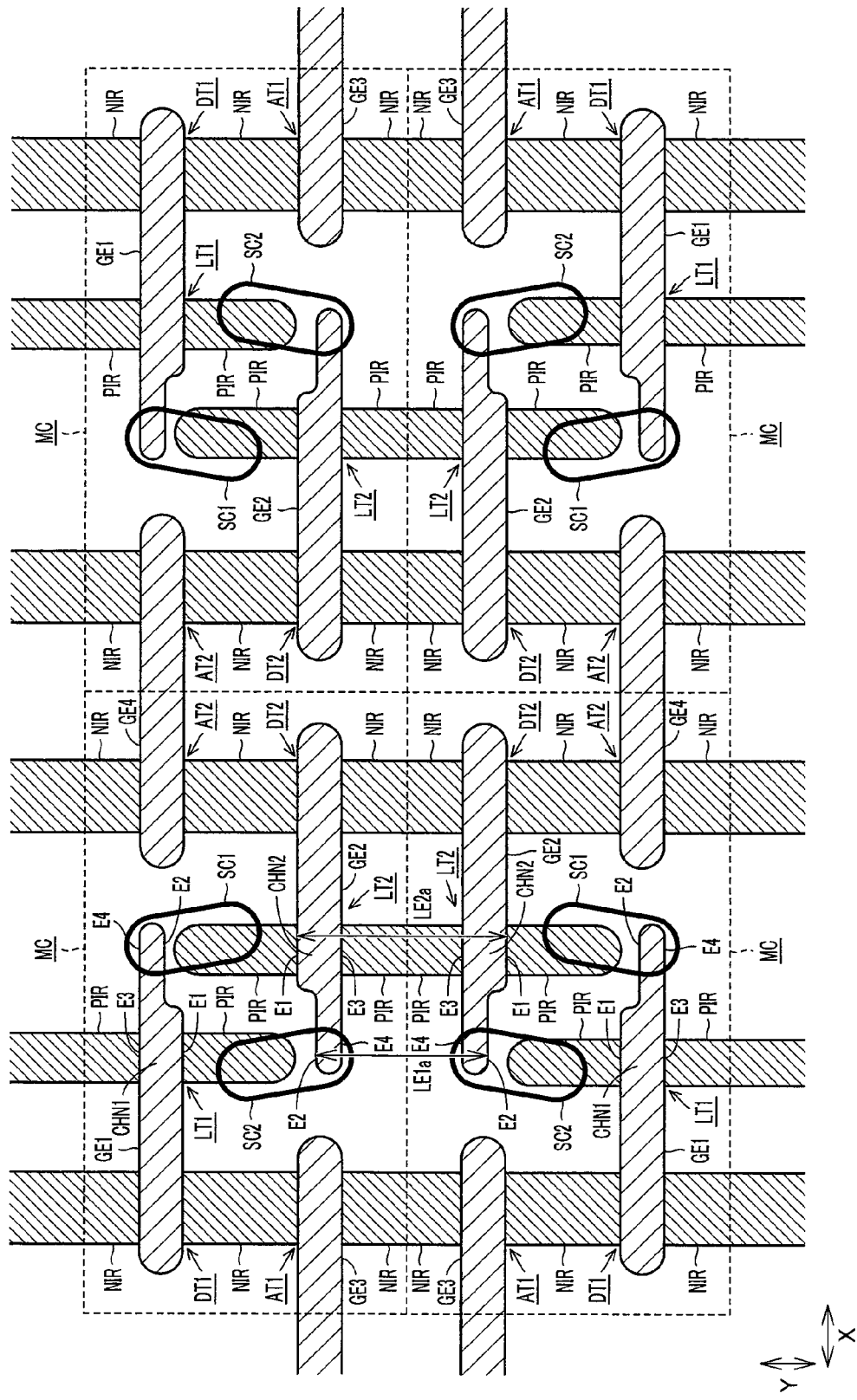
FIG. 27 is a plan view schematically showing configurations of MOS transistors and the shared contact holes when SRAM memory cells of the first embodiment are arrayed in a 2×2 matrix.

A configuration of each memory cell MC shown in FIG. 27 is substantially identical to the configuration of the memory cell MC shown in FIGS. 2 to 6.

Referring to FIG. 27, memory cells MC that are adjacent to each other in an X-direction of FIG. 27 have planar layouts that are symmetrical in relation to a virtual cell boundary line. One of gate electrode layers GE3 and GE4 is shared by memory cells MC adjacent to each other in the X-direction. That is, gate electrode layer GE3 of one of memory cells MC adjacent to each other in the X-direction and gate electrode layer GE3 of the other memory cell MC constitute an integrated conductive layer, or gate electrode layer GE4 of one of memory cells MC adjacent to each other in the X-direction and gate electrode layer GE4 of the other memory cell MC constitute an integrated conductive layer.

Memory cells MC that are adjacent to each other in a Y-direction of FIG. 27 have planar layouts that are symmetrical in relation to a virtual cell boundary line. In memory cells MC adjacent to each other in the Y-direction, each of source/drain regions NIR of access transistor AT1, source regions PIR of load transistor LT2, and source regions NIR of driver transistor DT2 is formed by the single impurity region, or each of source/drain regions NIR of access transistor AT2, source regions PIR of load transistor LT1, and source regions NIR of driver transistor DT1 is formed by the single impurity region.

In memory cells MC adjacent to each other in the Y-direction, sidewalls E3 and E4 of gate electrode layer GE2 are located opposite to each other in the planar view, or sidewalls E3 and E4 of gate electrode layer GE1 are located opposite to each other in the planar view.

In pair of memory cells MC that are adjacent to each other in the Y-direction such that sidewalls E3 and E4 of gate electrode layer GE2 are located opposite to each other in the planar view, a spacing LE2a between sidewall E1 of gate electrode layer GE2 of one of memory cells MC and sidewall E1 of gate electrode layer GE2 of the other memory cell MC is larger than a spacing LE1a between sidewall E2 of gate electrode layer GE2 of one of memory cells MC and sidewall E2 of gate electrode layer GE2 of the other memory cell MC.

In pair of memory cells MC that are adjacent to each other in the Y-direction such that sidewalls E3 and E4 of gate electrode layer GE1 are located opposite to each other in the planar view, a spacing between sidewall E1 of gate electrode layer GE1 of one of memory cells MC and sidewall E1 of gate electrode layer GE1 of the other memory cell MC is larger than a spacing between sidewall E2 of gate electrode layer GE1 of one of memory cells MC and sidewall E2 of gate electrode layer GE1 of the other memory cell MC.

Because other configurations of memory cell MC are substantially identical to those of the memory cell shown in FIGS. 2 to 6, the description is not repeated.

Figure 28:
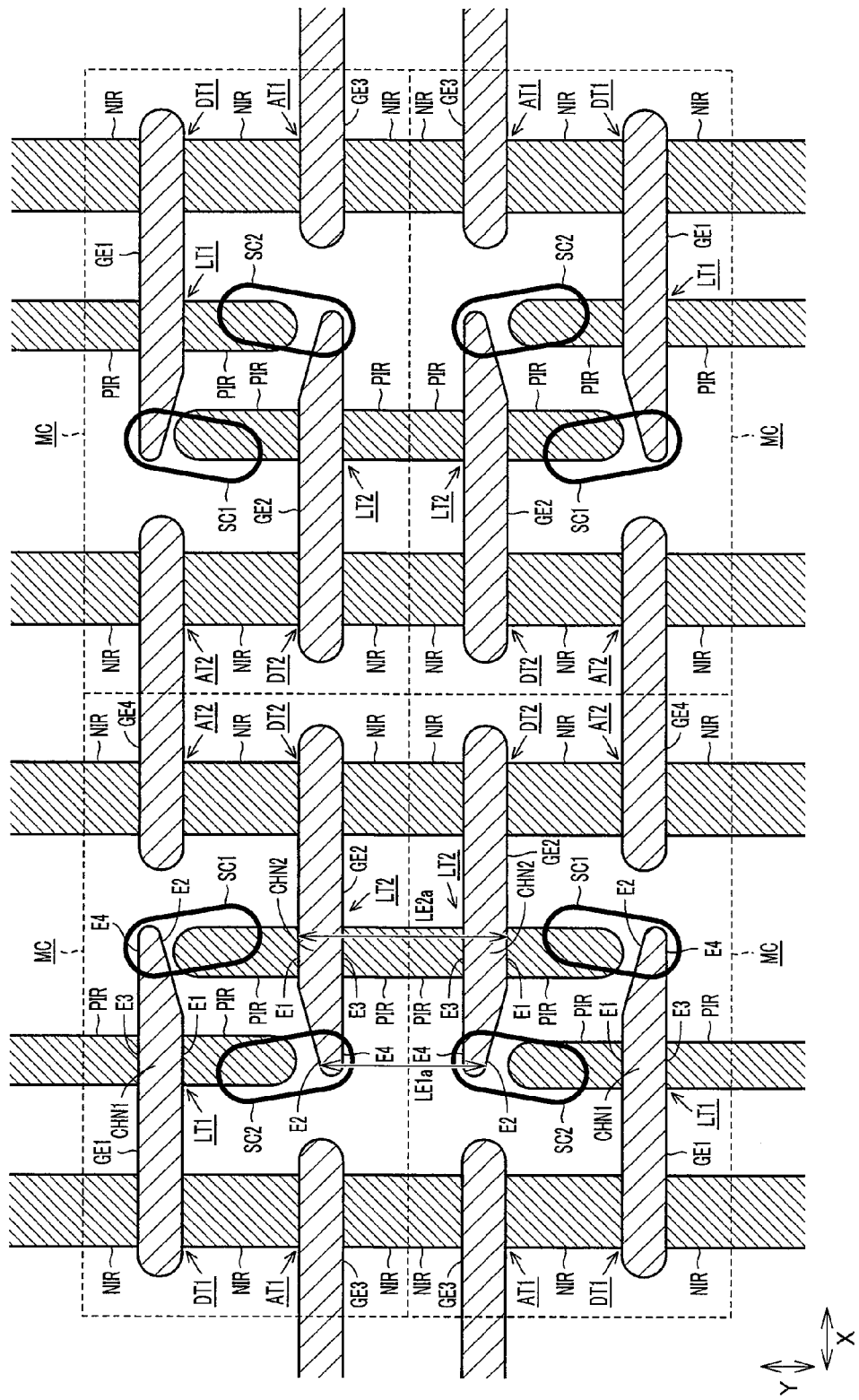
FIG. 28 is a plan view schematically showing configurations of MOS transistors and shared contact holes when SRAM memory cells of the second embodiment are arrayed in the 2×2 matrix.
Figure 29:
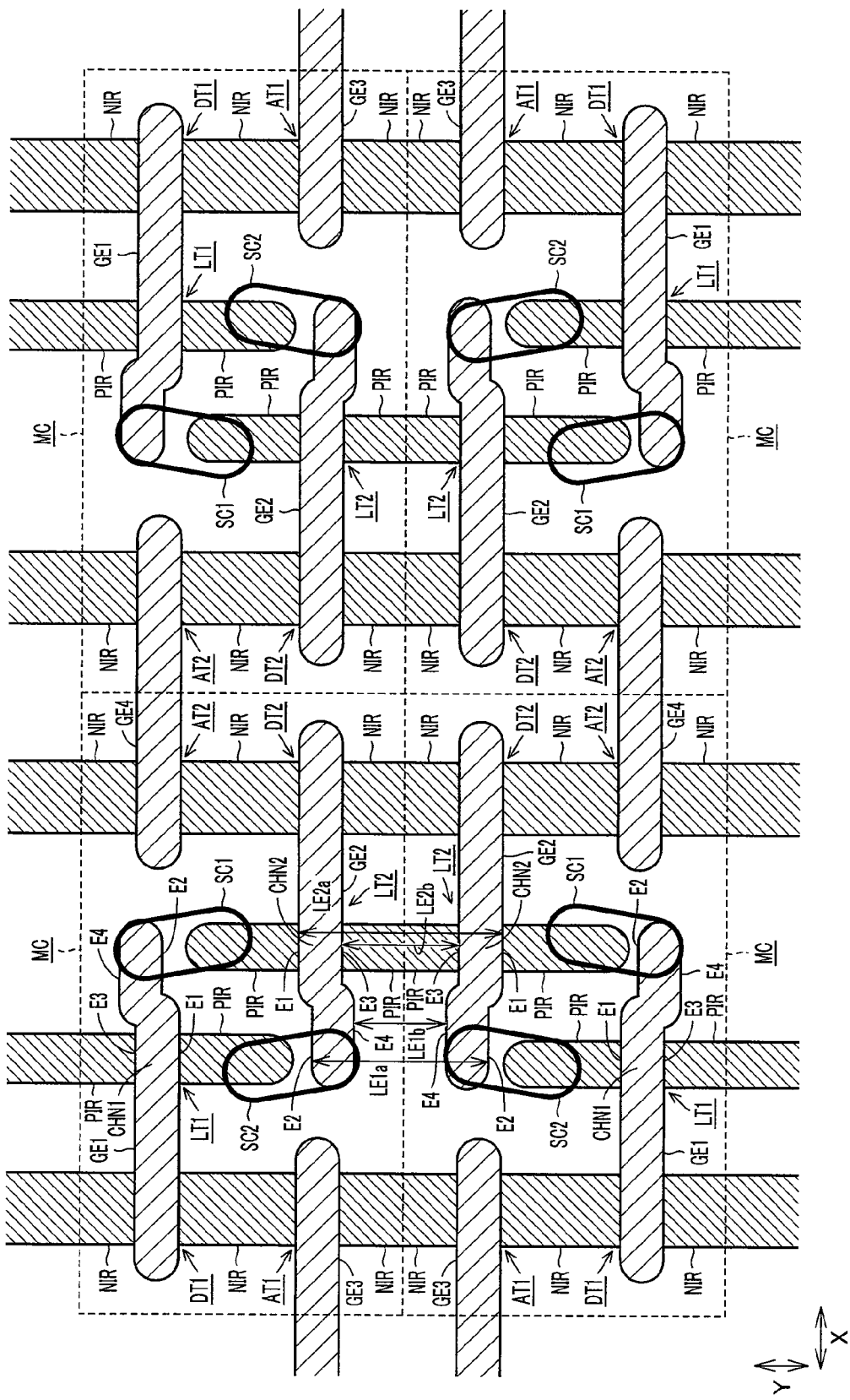
FIG. 29 is a plan view schematically showing configurations of MOS transistors and shared contact holes when SRAM memory cells of the third embodiment are arrayed in the 2×2 matrix.
Figure 30:
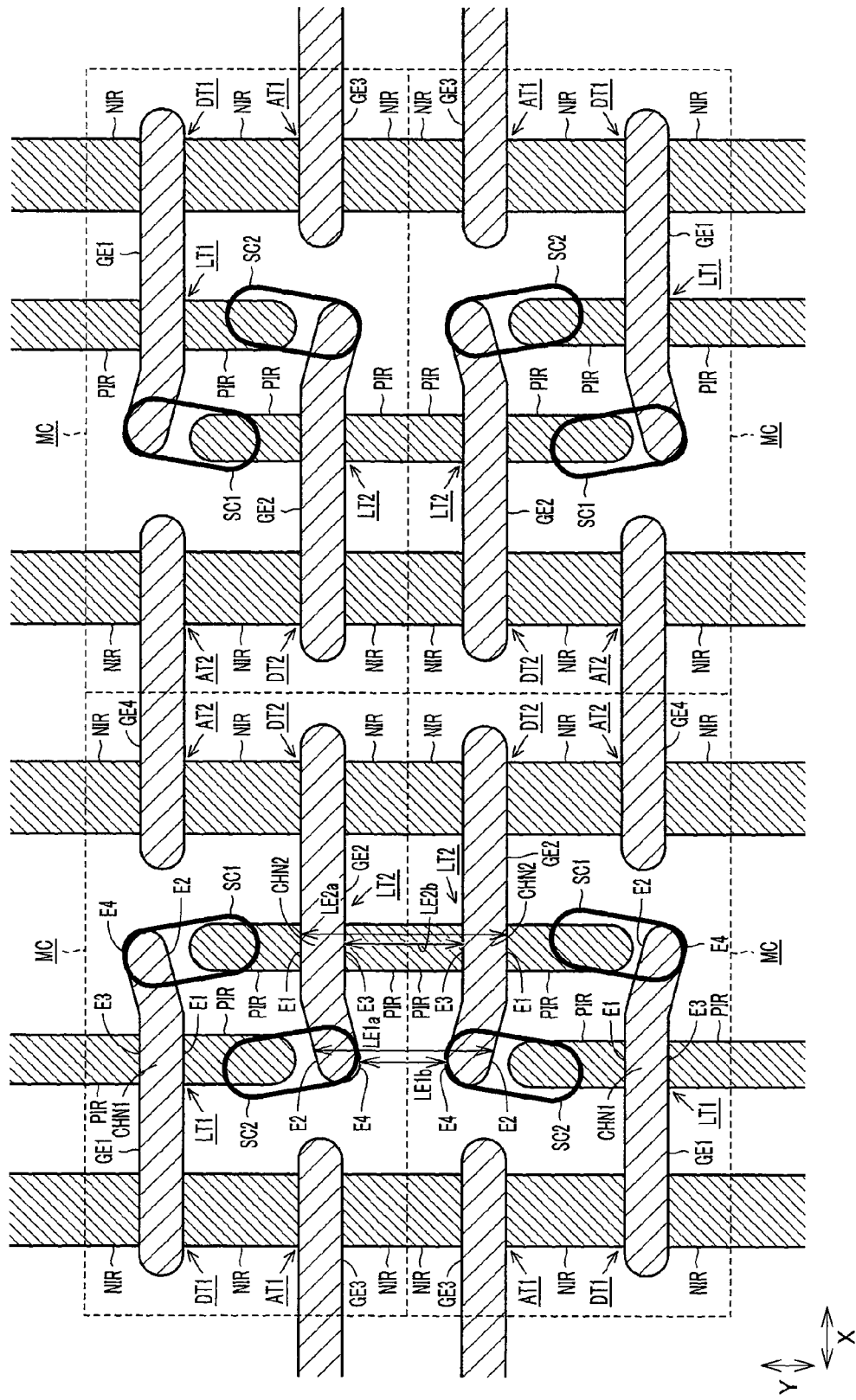
FIG. 30 is a plan view schematically showing configurations of MOS transistors and shared contact holes when SRAM memory cells of the fourth embodiment are arrayed in the 2×2 matrix.

The configuration of the SRAM memory cells arrayed in the 2×2 matrix can be applied to the configuration of the second embodiment as shown in FIG. 28, applied to the configuration of the third embodiment as shown in FIG. 29, and applied to the configuration of the fourth embodiment as shown in FIG. 30.

In the configurations of FIGS. 29 and 30, in pair of memory cells MC that are adjacent to each other in the Y-direction of the drawings such that sidewalls E3 and E4 of gate electrode layer GE2 are located opposite to each other in the planar view, a spacing LE2b between sidewall E3 of gate electrode layer GE2 of one of memory cells MC and sidewall E3 of gate electrode layer GE2 of the other memory cell MC is larger than a spacing LE1b between sidewall E4 of gate electrode layer GE2 of one of memory cells MC and sidewall E4 of gate electrode layer GE2 of the other memory cell MC.

In pair of memory cells MC that are adjacent to each other in the Y-direction of the drawings such that sidewalls E3 and E4 of gate electrode layer GE1 are located opposite to each other in the planar view, a spacing between sidewall E3 of gate electrode layer GE1 of one of memory cells MC and sidewall E3 of gate electrode layer GE1 of the other memory cell MC is larger than a spacing between sidewall E4 of gate electrode layer GE1 of one of memory cells MC and sidewall E4 of gate electrode layer GE1 of the other memory cell MC.

In the arrangement of the plural SRAM memory cells, as shown in FIGS. 27 to 30, in the portion that shared contact hole SC1 of gate electrode layer GE1 reaches, sidewall E2 is retreated toward the side of sidewall E3 with respect to the virtual extended line of sidewall E1 in the planar view by combining with one of the shapes of the gate electrode layers of the first to fourth embodiments. Therefore, the generation of the opening defect can be suppressed in forming shared contact hole SC1.

Similarly the generation of the opening defect can be suppressed for shared contact hole SC2.

(Application to Content Addressable Memory)

The configurations of the first to fourth embodiments can also be applied to a CAM (Content Addressable Memory) memory cell whose storage unit has the configuration of the SRAM memory cell. CAM memory cell in which three-level data is stored, that is, TCAM (Ternary CAM) will be described below by way of example.

A circuit configuration and an operation of the TCAM cell will be described.

Figure 31:
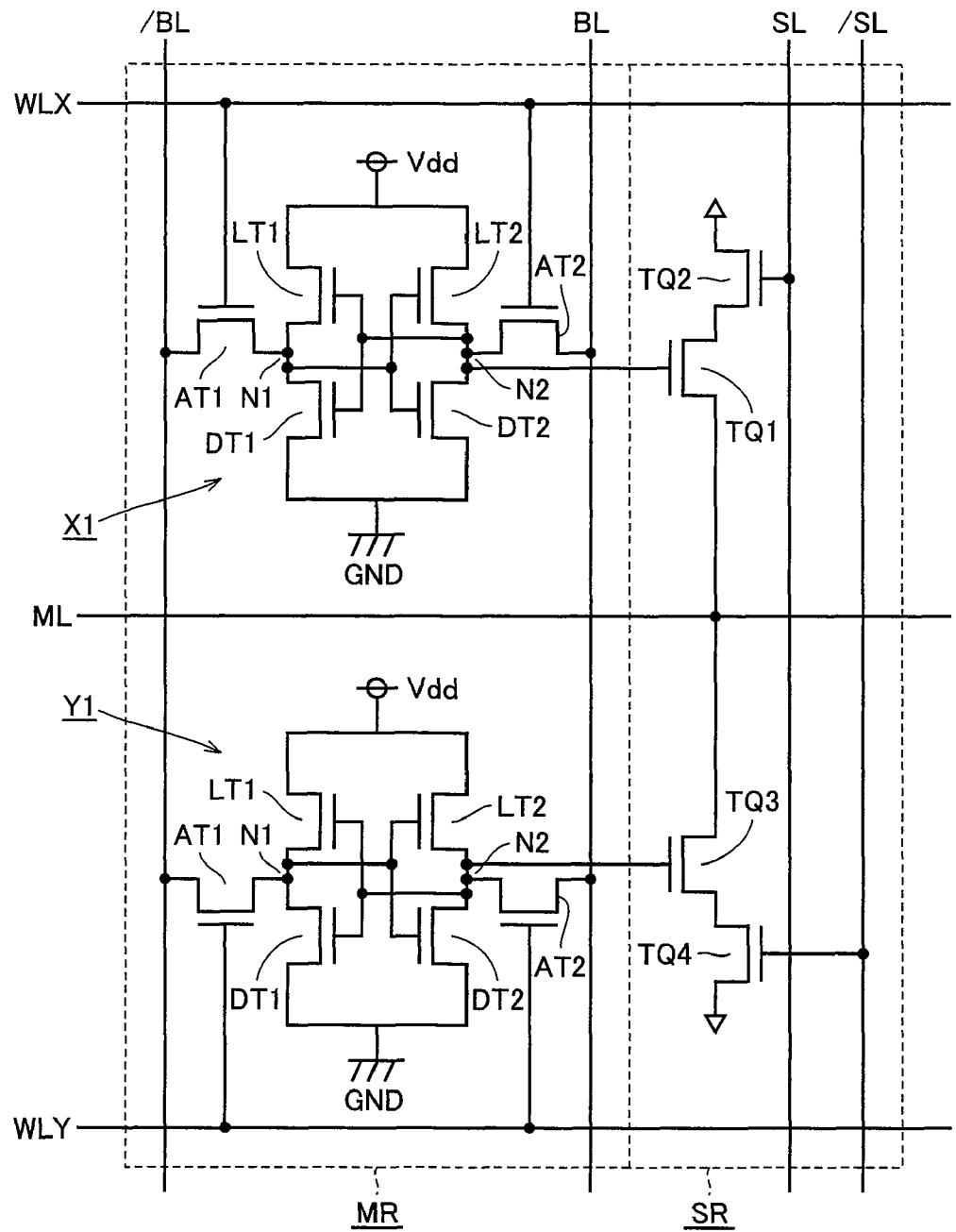
FIG. 31 is a circuit diagram showing a configuration of a TCAM cell in which a storage unit has a configuration of the SRAM memory cell.

Referring to FIG. 31, the TCAM cell includes a data storage unit MR and a search unit SR. Search candidate data is stored in data storage unit MR. Search unit SR compares the search candidate data and pieces of search data SL and /SL, and search unit SR drives a match line ML according to the comparison result.

Data storage unit MR includes two memory cells (cell X1 and cell Y1). Each of cell X1 and cell Y1 has the configuration of the SRAM memory cell. Cell X1 and cell Y1 have the same structure, and cell X1 and cell Y1 have the same structure as the SRAM memory cell of FIG. 1. Therefore, in FIG. 31, the same component of cell X1 and cell Y1 as the SRAM memory cell of FIG. 1 is designated by the same numeral, and the description is not repeated.

The three-level data can be stored in the TCAM cell by utilizing two memory cells X1 and Y1.

Search unit SR includes MOS transistors TQ1 and TQ2 provided in relation to cell X1 and MOS transistors TQ3 and TQ4 provided in relation to cell Y1. MOS transistors TQ1 and TQ2 are connected in series between match line ML and a ground node. The gate of MOS transistor TQ1 is connected to a storage node N2 of cell X1. The gate of MOS transistor TQ2 is connected to a search candidate data bit line SL.

MOS transistors TQ3 and TQ4 are connected in series between match line ML and the ground node. The gate of MOS transistor TQ3 is connected to a storage node N2 of cell Y1. The gate of MOS transistor TQ4 is connected to a search data inverted bit line /SL.

In cell X1 and cell Y1, storage data can individually be set according to word line drive signals WLX and WLY. The TCAM cell realizes the three-level state as follows.

(1) In the Case where Storage Node N2 of Cell X1 is Set at a H-Level (Logical High Level) and Storage Node N2 of Cell Y1 is Set at an L-Level (Logical Low Level):

In this case, when search data bit line (hereinafter simply referred to as search data) SL is set at the H-level, MOS transistors TQ1 and TQ2 are put in the conduction state to discharge match line ML. Inverted data of the search candidate data is stored in cell X1. Accordingly, this state is a miss-hit state. On the other hand, when search data SL is set at the L-level, MOS transistor TQ2 is put in the non-conduction state and MOS transistor TQ3 is also put in the non-conduction state. Accordingly, match line ML is not discharged in this state, but match line is maintained at a pre-charge voltage level. This state is a hit state in which the search data and the storage data are matched with each other.

(2) In the Case where Storage Node N1 of Cell X1 is Set at the L-Level and Storage Node N2 of Cell Y1 is Set at the H-Level:

In this case, when search data SL is set at the H-level, complementary search data /SL is set at the H-level. Accordingly, MOS transistors TQ3 and TQ4 are put in the conduction state to discharge match line ML. Search data /SL is the complementary search data. Therefore, this state is the miss-hit state. On the other hand, when search data SL is set at the H-level, complementary search data /SL is set at the L-level. Accordingly, MOS transistor TQ4 is put in the non-conduction state and MOS transistor TQ1 is also put in the non-conduction state. Accordingly, match line ML is maintained at the pre-charge voltage level. Therefore, this state is the hit state.

(3) In the Case where Both Storage Nodes N2 of Cell X1 and Cell Y1 are Set at the L-Level:

In this state, both MOS transistors TQ1 and TQ3 are put in the non-conduction state. Accordingly, match line ML is maintained at the pre-charge voltage level irrespective of a logical value of search data SL. Accordingly, "don't-care-state" can be realized for search data SL by this state.

(4) In the Case where Both Storage Nodes N2 of Cell X1 and Cell Y1 are Set at the H-Level:

In this state, one of a passage of MOS transistors TQ1 and TQ2 and a passage of MOS transistors TQ3 and TQ4 is put in the conduction state in response to the logical value of search data SL to discharge match line ML. Accordingly, because the miss-hit state is always assigned irrespective of the search data, usually this state is a prohibition state.

Thus, the three-level data including the state (1) of H-data storage, the state (2) of L-data storage, and the state (3) of the don't-care-state can be stored in the TCAM cell.

The planar layout TCAM cell in which the configuration of the first embodiment is applied to a circuit configuration of FIG. 31 will be described below.

Figure 33:
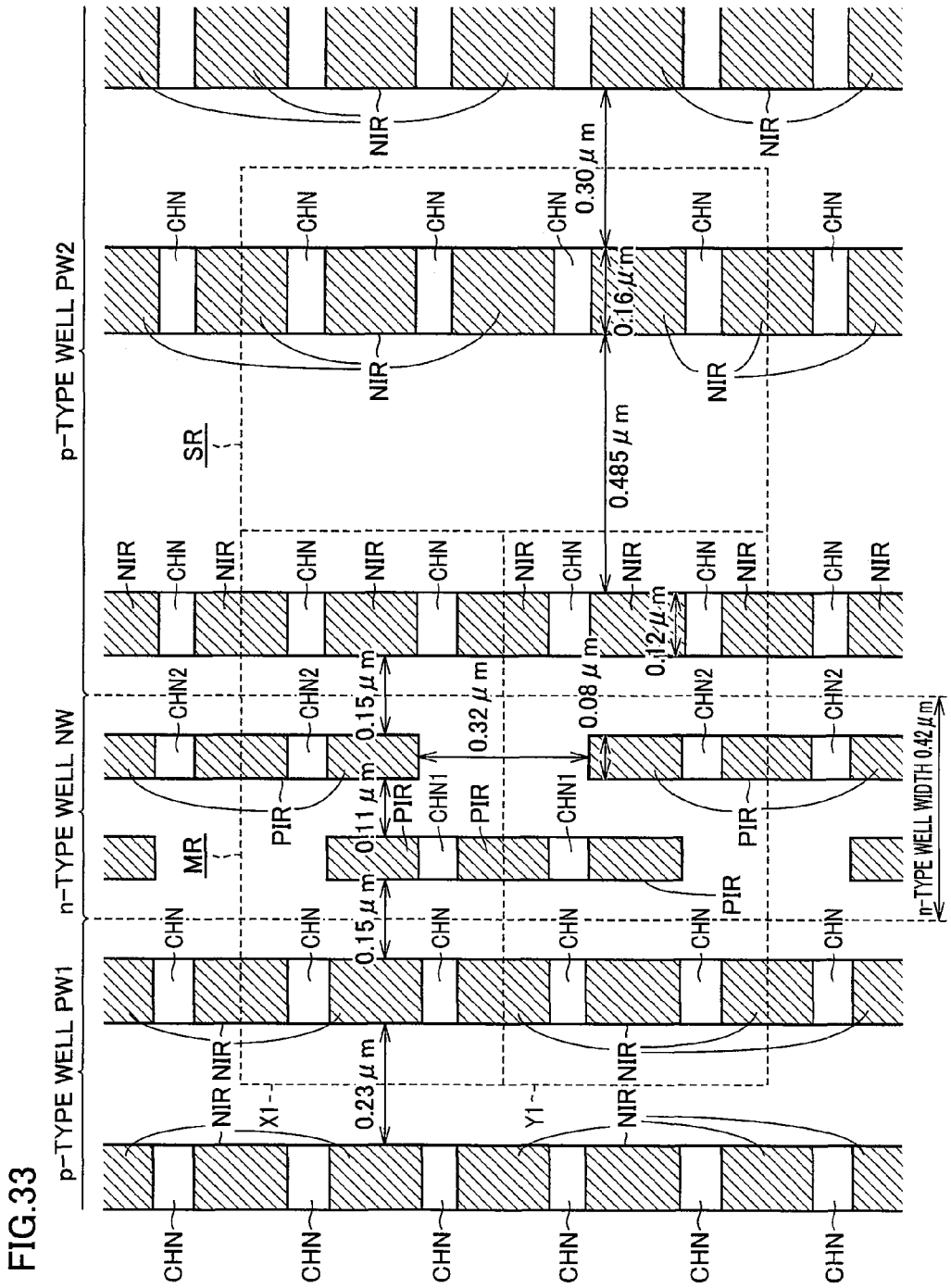
FIG. 33 is a plan view showing the planar layout of FIG. 32 from a lower layer.
Figure 34:
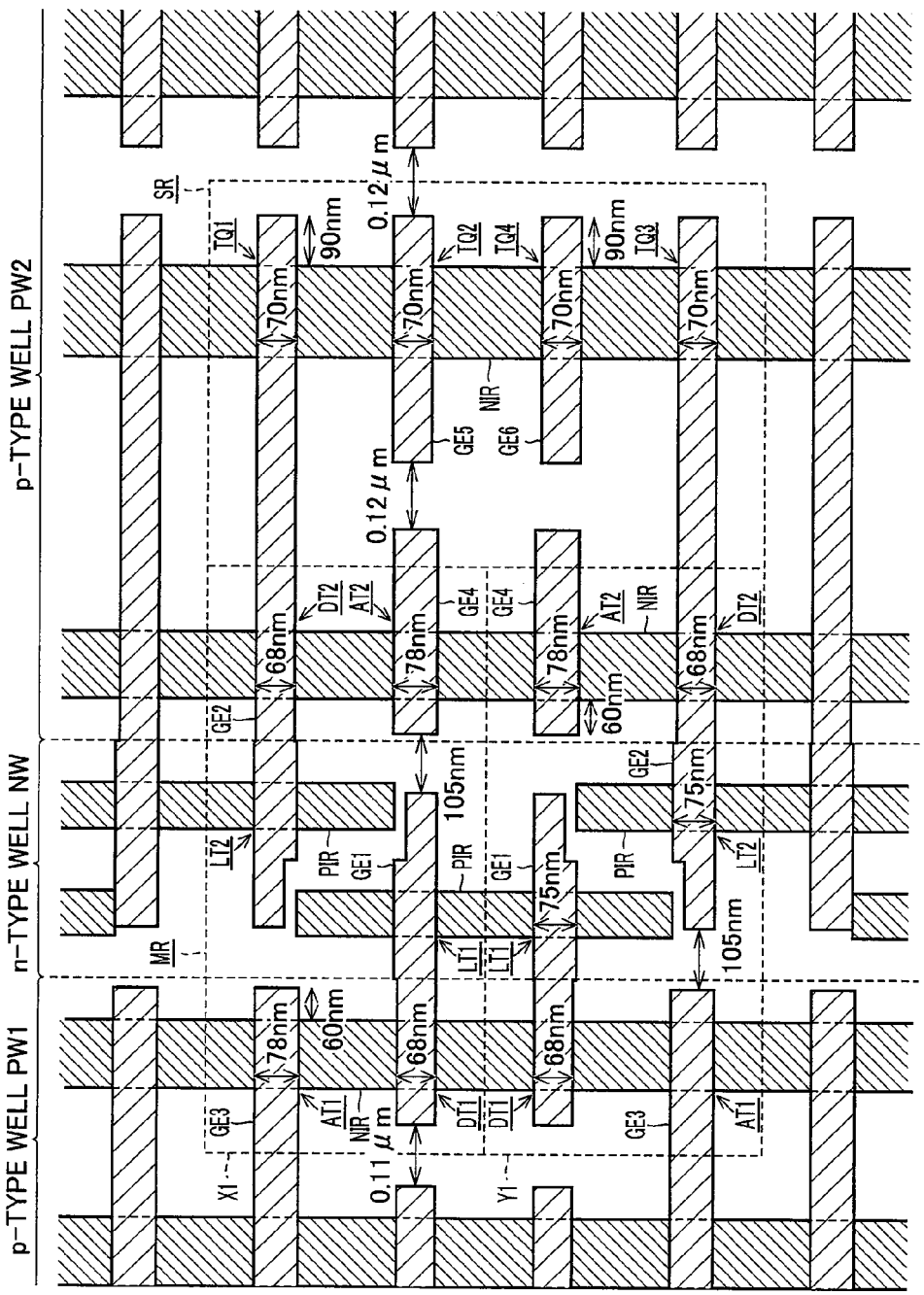
FIG. 34 is a plan view showing the planar layout of FIG. 32 from the lower layer.
Figure 35:
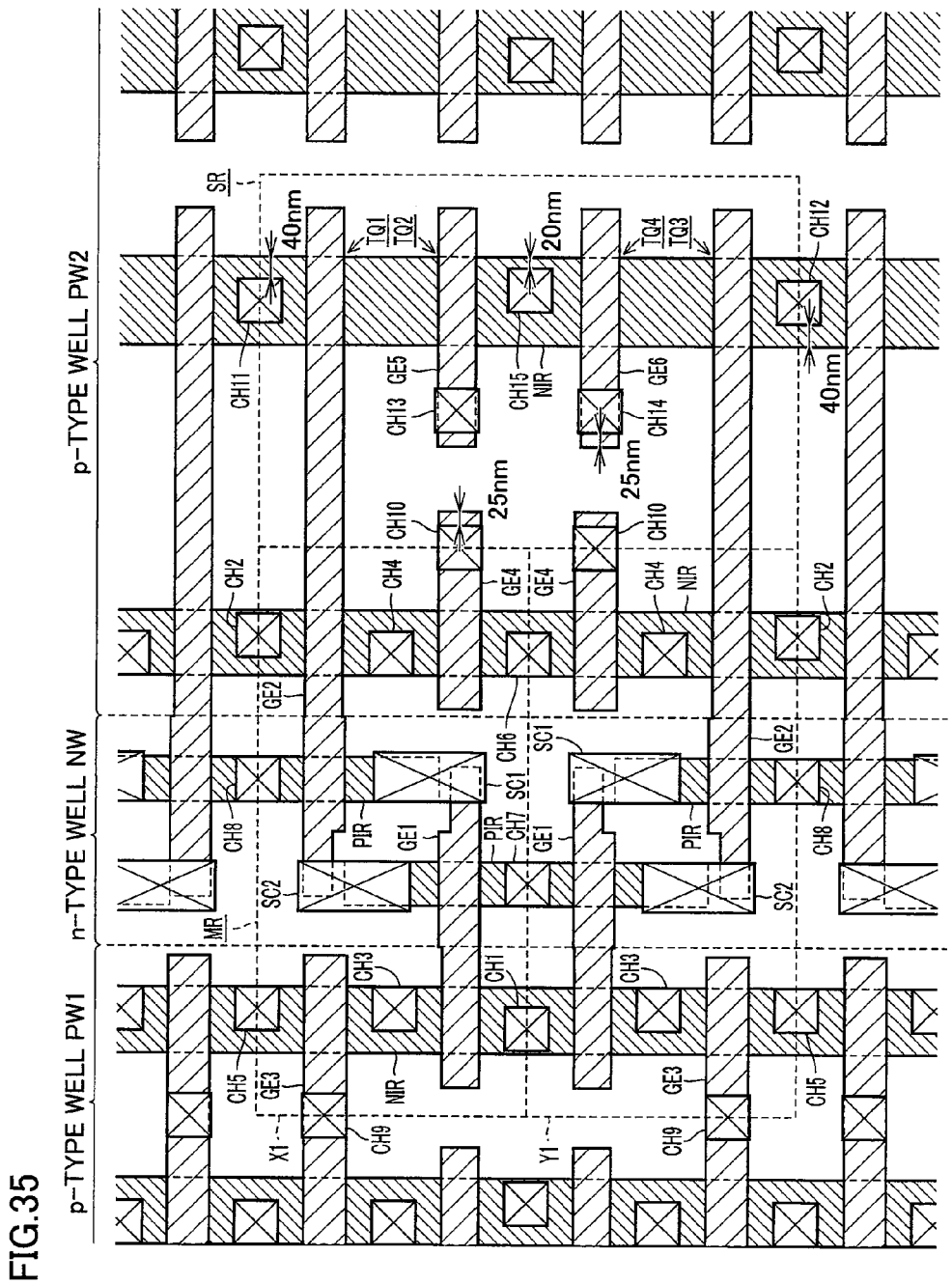
FIG. 35 is a plan view showing the planar layout of FIG. 32 from the lower layer.
Figure 36:
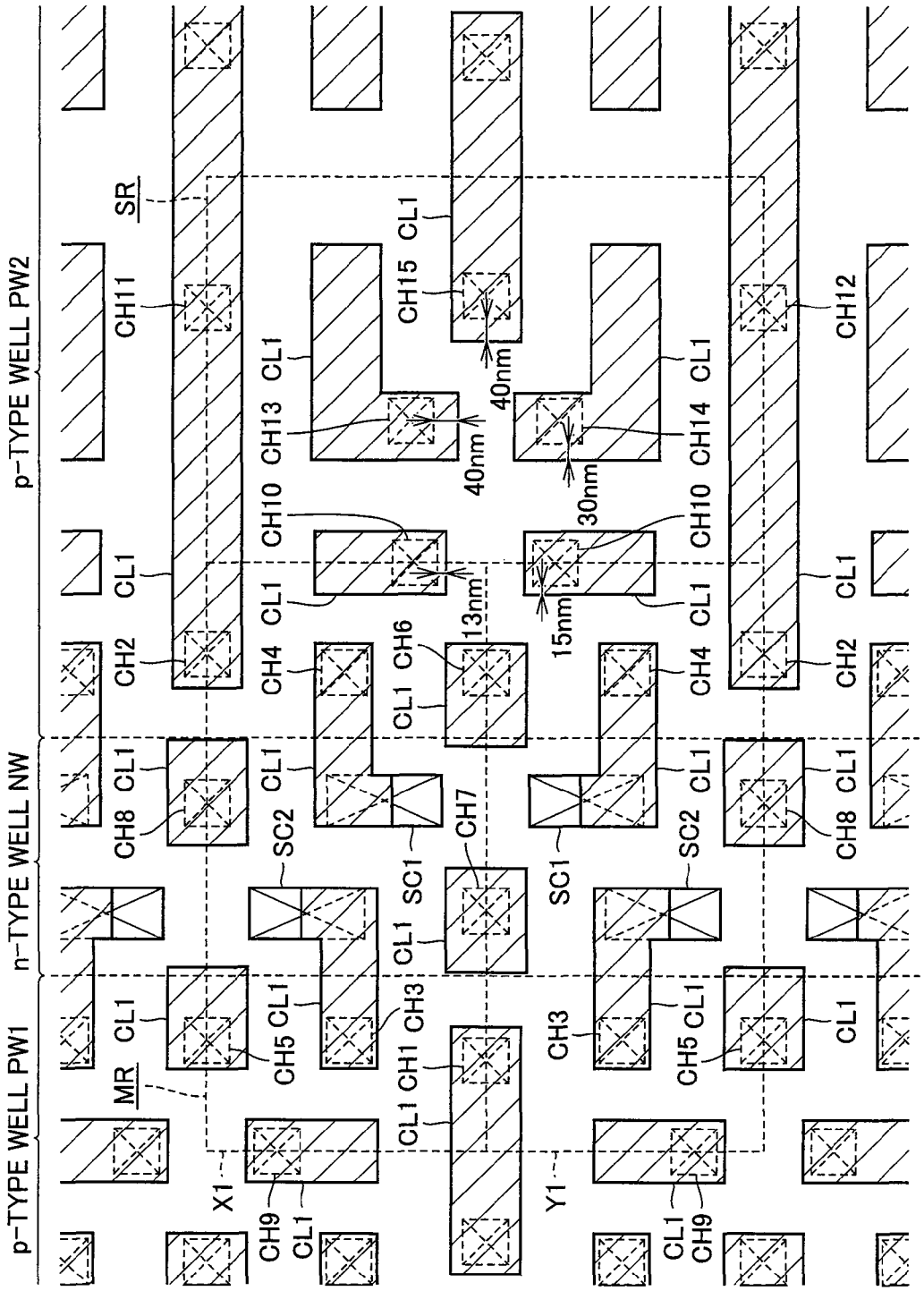
FIG. 36 is a plan view showing the planar layout of FIG. 32 from the lower layer.

FIG. 33 shows an active region that is electrically isolated by an isolation structure and an impurity region that is formed in the active region. FIG. 34 shows a configuration in which a gate electrode layer is added to the planar layout of FIG. 33. FIG. 35 shows arrangement positions of usual contact holes and shared contact holes made in an inter-layer insulator with which the gate electrode layer is covered. FIG. 36 shows a pattern of a conductive layer formed on the inter-layer insulator of FIG. 35.

Figure 32:
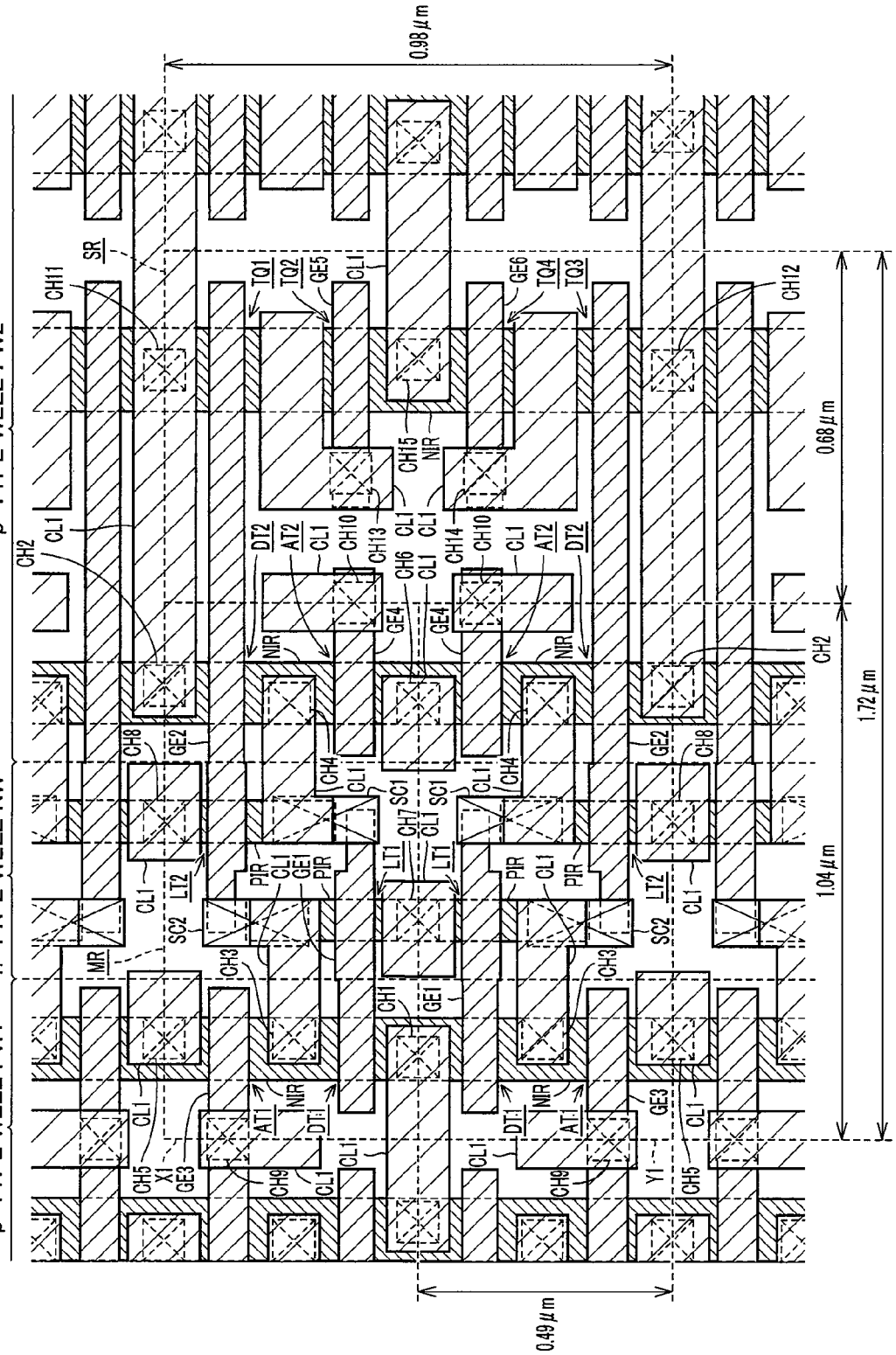
FIG. 32 is a plan view showing a planar layout of the TCAM cell to which the configuration of the first embodiment is applied.

Referring to FIGS. 32 and 33, the isolation structure is selectively formed in the surface of the semiconductor substrate in which p-type well regions PW1 and PW2 and n-type well region NW are formed, thereby electrically isolating the plural active regions from one another in the surface of the semiconductor substrate. N-type impurity region NIR is formed in each active region located in p-type well regions PW1 and PW2, and p-type impurity region PIR is formed in each active region located in n-type well region NW.

N-type impurity region NIR constitutes the source/drain region of the nMOS transistor, and p-type channel formation region CHN is sandwiched between pair of n-type impurity regions NIR. P-type impurity region PIR constitutes the source/drain region of the pMOS transistor, and n-type channel formation region CHN1 or CHN2 is sandwiched between pair of p-type impurity regions PIR.

Referring to FIGS. 32 and 34, gate electrode layers GE1 to GE6 are formed on channel formation regions CHN, CHN1, and CHN2. The planar shapes and the planar layout of gate electrode layers GE1 to GE4 in cell X1 and cell Y1 of data storage unit MR are similar to those of the SRAM memory cell of the first embodiment shown in FIG. 2.

In search unit SR, pair of n-type impurity region NIR and gate electrode layer GE2 constitute nMOS transistor TQ1, and pair of n-type impurity region NIR and gate electrode layer GE5 constitute NMOS transistor TQ2. Pair of n-type impurity regions NIR and gate electrode layer GE2 constitutes nMOS transistor TQ3, and pair of n-type impurity regions NIR and gate electrode layer GE6 constitute nMOS transistor TQ4.

Gate electrode layer GE2 of nMOS transistor TQ1 is formed by the conductive layer in which load transistor LT2 of cell X1 and each gate electrode layer GE2 of driver transistor DT2 are integrated. Gate electrode layer GE2 of nMOS transistor TQ3 is formed by the conductive layer in which load transistor LT2 of cell X2 and each gate electrode layer GE2 of driver transistor DT2 are integrated.

Referring to FIGS. 32 and 35, an inter-layer insulator (not shown) is formed such that the isolation structure, the active region, and the gate electrode layer are covered therewith, and shared contact holes SC1 and SC2 and usual contact holes CH1 to CH15 are made in the inter-layer insulator.

The planar layout of shared contact holes SC1 and SC2 and usual contact holes CH1 to CH10 in cell X1 and cell Y1 of data storage unit MR is similar to that of the SRAM memory cell of the first embodiment shown in FIG. 2.

In search unit SR, contact hole CR11 reaches source/drain region NIR of nMOS transistor TQ1, and contact hole CH12 reaches source/drain region NIR of nMOS transistor TQ3. Contact hole CH13 reaches gate electrode layer GE5 of nMOS transistor TQ2, and contact hole CH14 reaches gate electrode layer GE6 of nMOS transistor TQ4. Contact hole CH15 reaches source/drain region NIR that is shared by nMOS transistors TQ2 and TQ4.

Referring to FIGS. 32 and 36, conductive layer CL1 to which the patterning is performed into a predetermined shape is formed on the inter-layer insulator in which shared contact holes SC1 and SC2 and contact holes CH1 to CH10 are made.

The planar shape and planar layout of conductive layer CL1 in cell X1 and cell Y1 of data storage unit MR are similar to those of the SRAM memory cell of the first embodiment shown in FIG. 2.

In search unit SR, conductive layer CL1 is formed so as to electrically connect contact hole CH2 of cell X1 and contact hole CH11, and conductive layer CL1 is formed so as to electrically connect contact hole CH2 of cell X2 and contact hole CH12.

Conductive layer CL1 electrically connected to contact hole CH13, conductive layer CL1 electrically connected to contact hole CH14, and conductive layer CL1 electrically connected to contact hole CH15 are formed while separated from one another.

Figure 37:
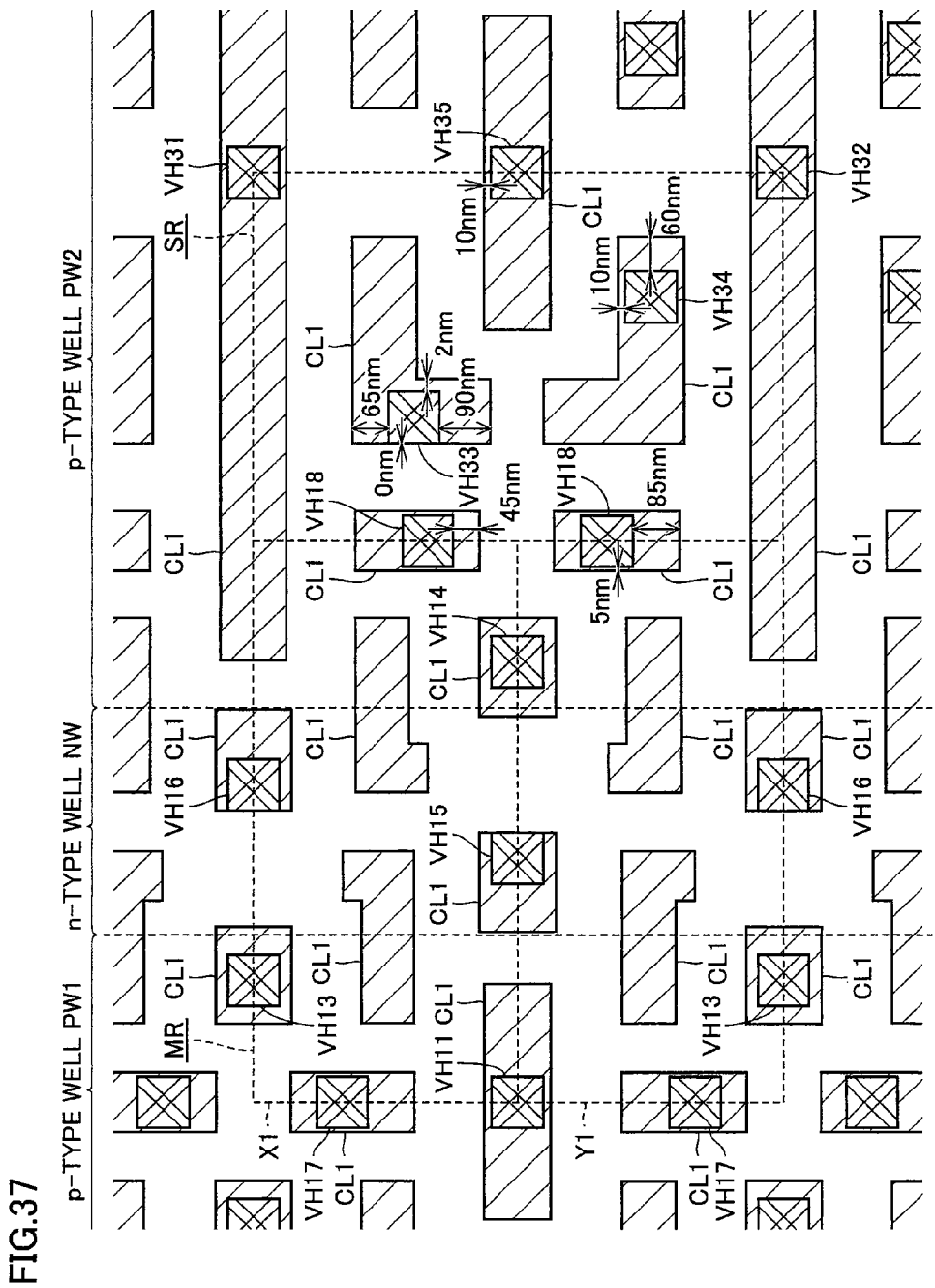
FIG. 37 is a plan view showing a planar layout located above the planar layout of FIG. 32.
Figure 38:
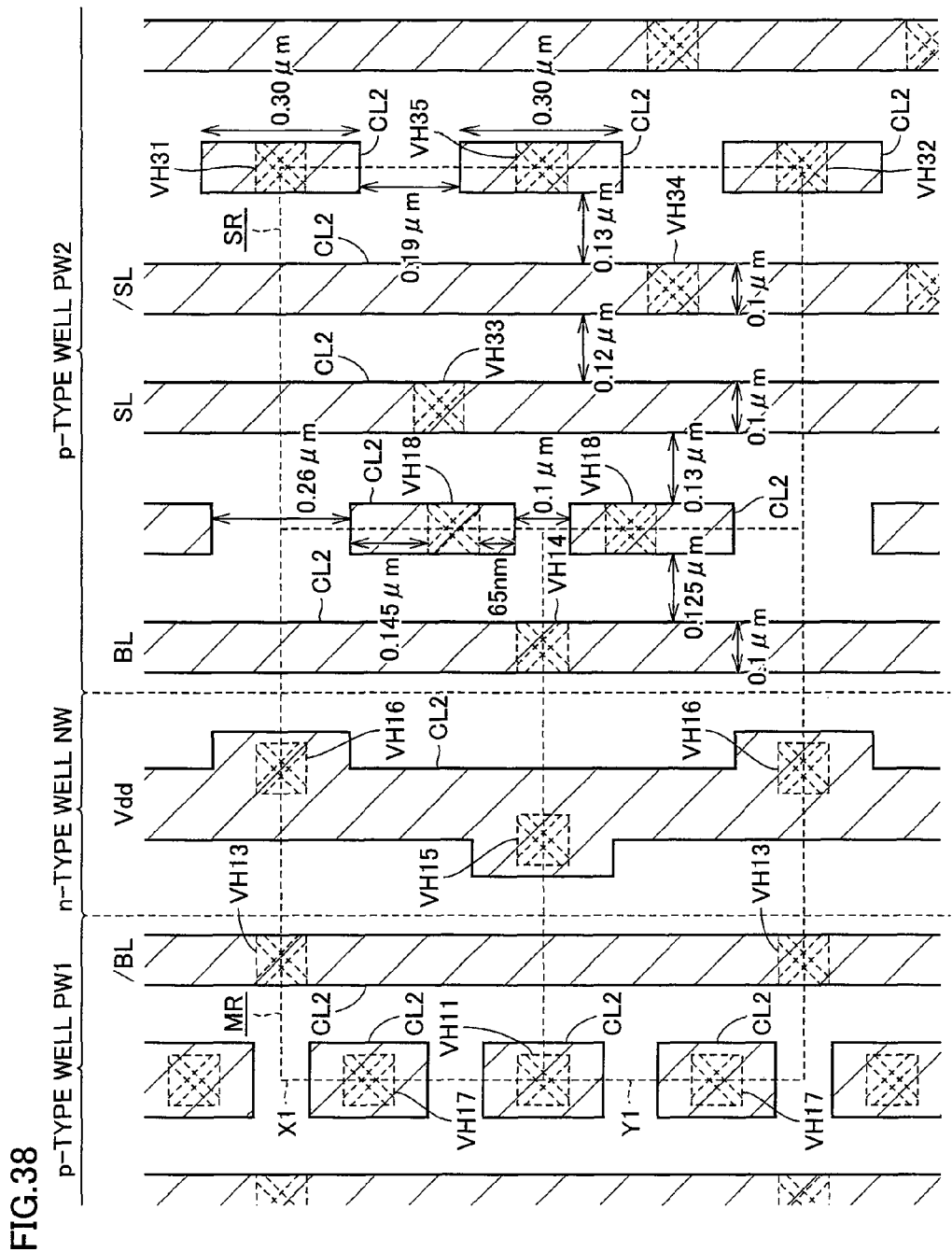
FIG. 38 is a plan view showing a planar layout located above the planar layout of FIG. 32.

FIGS. 37 and 38 are plan views showing a planar layout located above the planar layout of FIG. 32. FIG. 37 shows arrangement positions of via holes made in an inter-layer insulator with which a conductive layer is covered. FIG. 38 shows a patter of a conductive layer formed on the inter-layer insulator of FIG. 37.

Referring to FIG. 37, an inter-layer insulator (not shown) is formed such that conductive layer CL1 is covered therewith, and via holes VH11, VH13 to VH18, and VH31 to VH35 are made in inter-layer insulator.

The planar layout of via holes VH11 and VH13 to VH18 in cell X1 and cell Y1 of data storage unit MR is similar to that of the SRAM memory cell of the first embodiment shown in FIG. 3.

In search unit SR, via hole VH31 reaches conductive layer CL1 in order to electrically connect contact hole CH11 and contact hole CH2, and via hole VH32 reaches conductive layer CL1 in order to electrically connect contact hole CH12 and contact hole CH2. Via hole VH33 reaches conductive layer CL1 in order to be electrically connected to contact hole CH13, via hole VH34 reaches conductive layer CL1 in order to be electrically connected to contact hole CH14, and via hole VH35 reaches conductive layer CL1 in order to be electrically connected to contact hole CH15.

Referring to FIG. 38, conductive layer CL2 to which the patterning is performed into a predetermined shape is formed on the inter-layer insulator in which via holes VH11 to VH18 and VH31 to VH35 are made.

The planar shape and planar layout of conductive layer CL2 in cell X1 and cell Y1 of data storage unit MR are similar to those of the SRAM memory cell of the first embodiment shown in FIG. 3.

In search unit SR, search data line SL including conductive layer CL2 electrically connected to via hole VH33 is formed. Complementary search data line /SL including conductive layer CL2 electrically connected to via hole VH34 is formed. Search data line SL and complementary search data line /SL are extended in parallel with each other.

Conductive layer CL2 electrically connected to contact hole CH31, conductive layer CL2 electrically connected to contact hole CH32, and conductive layer CL2 electrically connected to contact hole CH35 are formed while separated from one another.

The planar layout of the TCAM cell in which the configuration of the first embodiment is applied to the circuit configuration of FIG. 31 is formed as described above.

Figure 39:
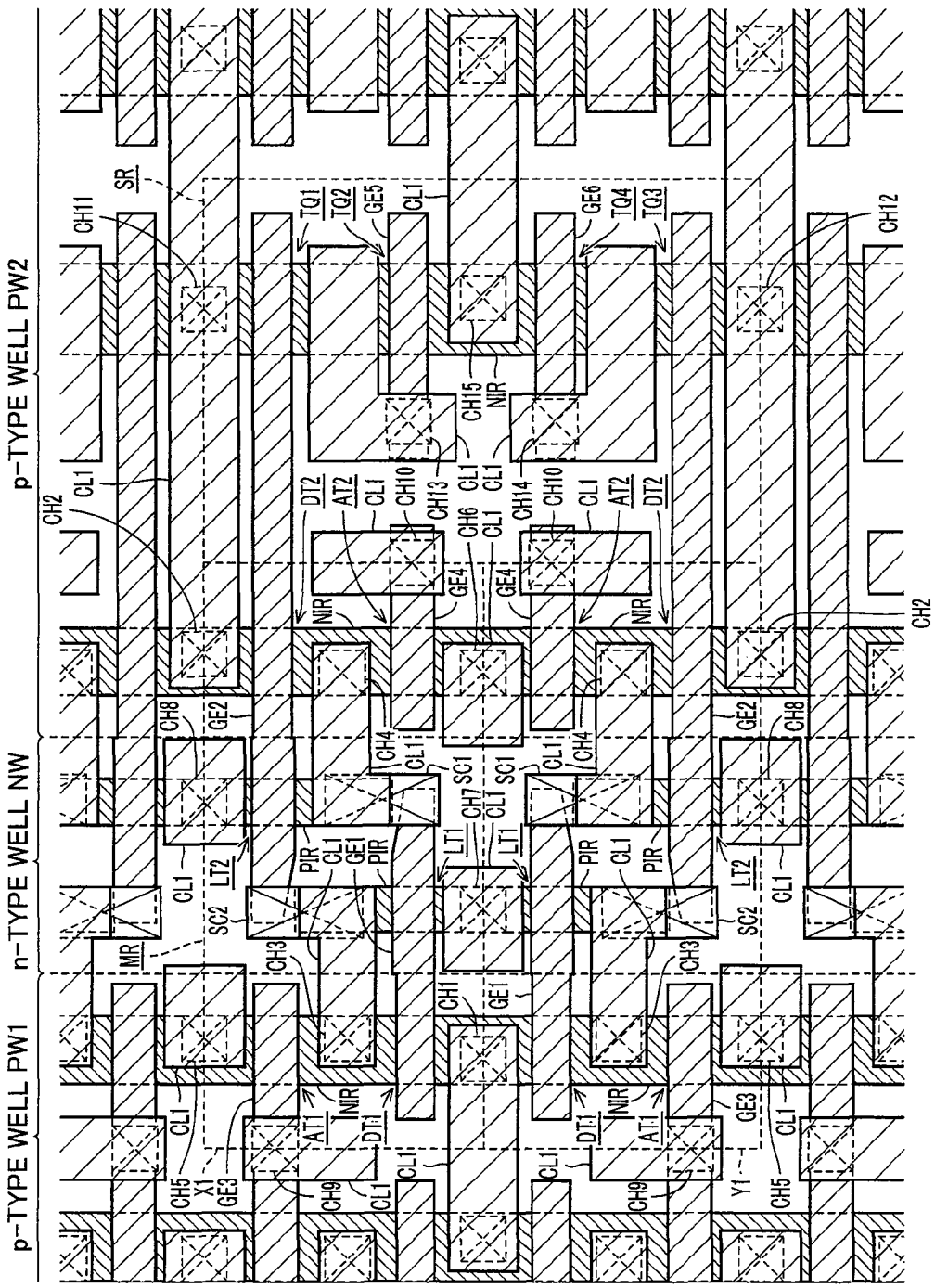
FIG. 39 is a plan view showing a planar layout of a TCAM cell to which the configuration of the second embodiment is applied.
Figure 40:
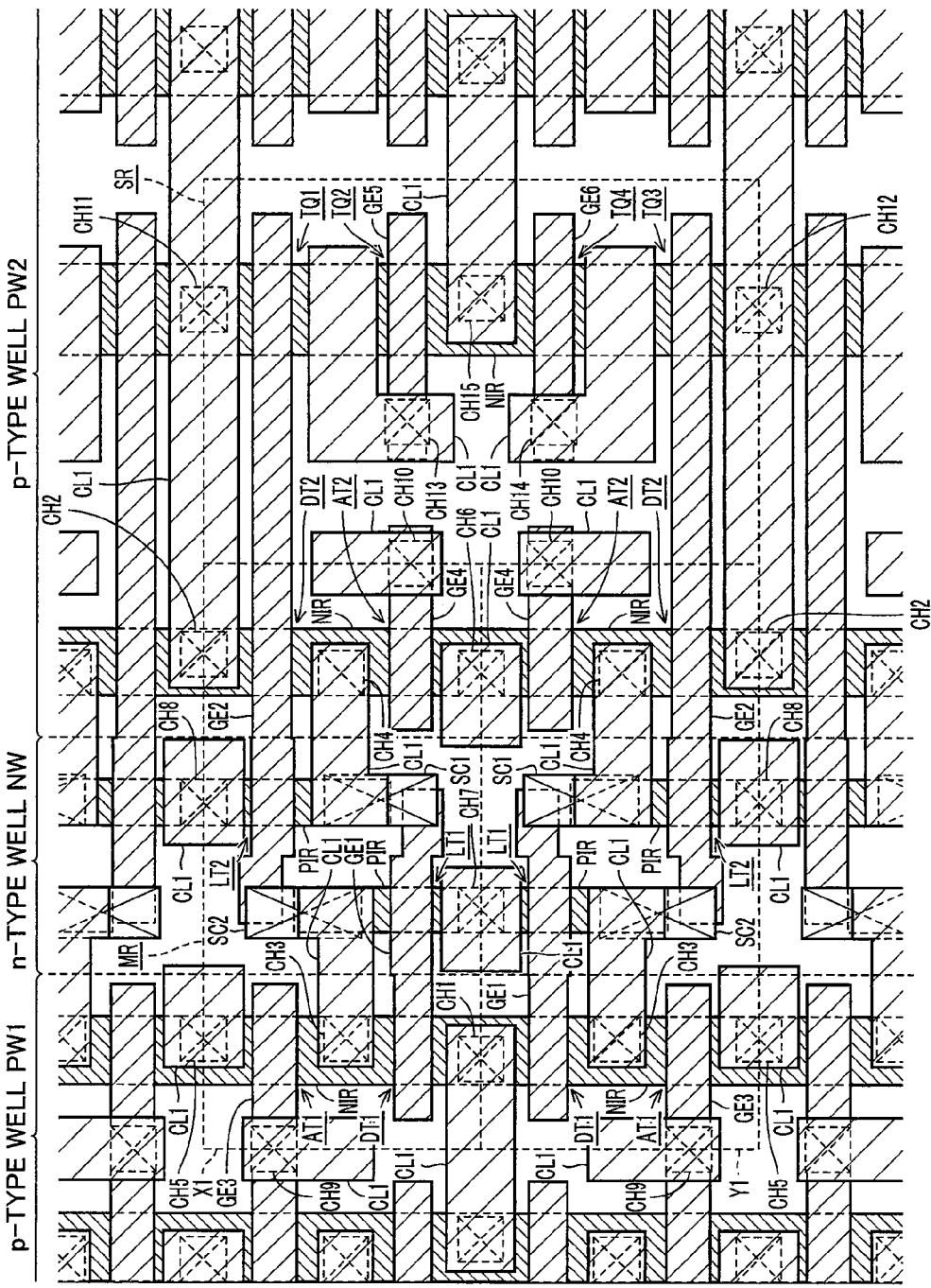
FIG. 40 is a plan view showing a planar layout of a TCAM cell to which the configuration of the third embodiment is applied.
Figure 41:
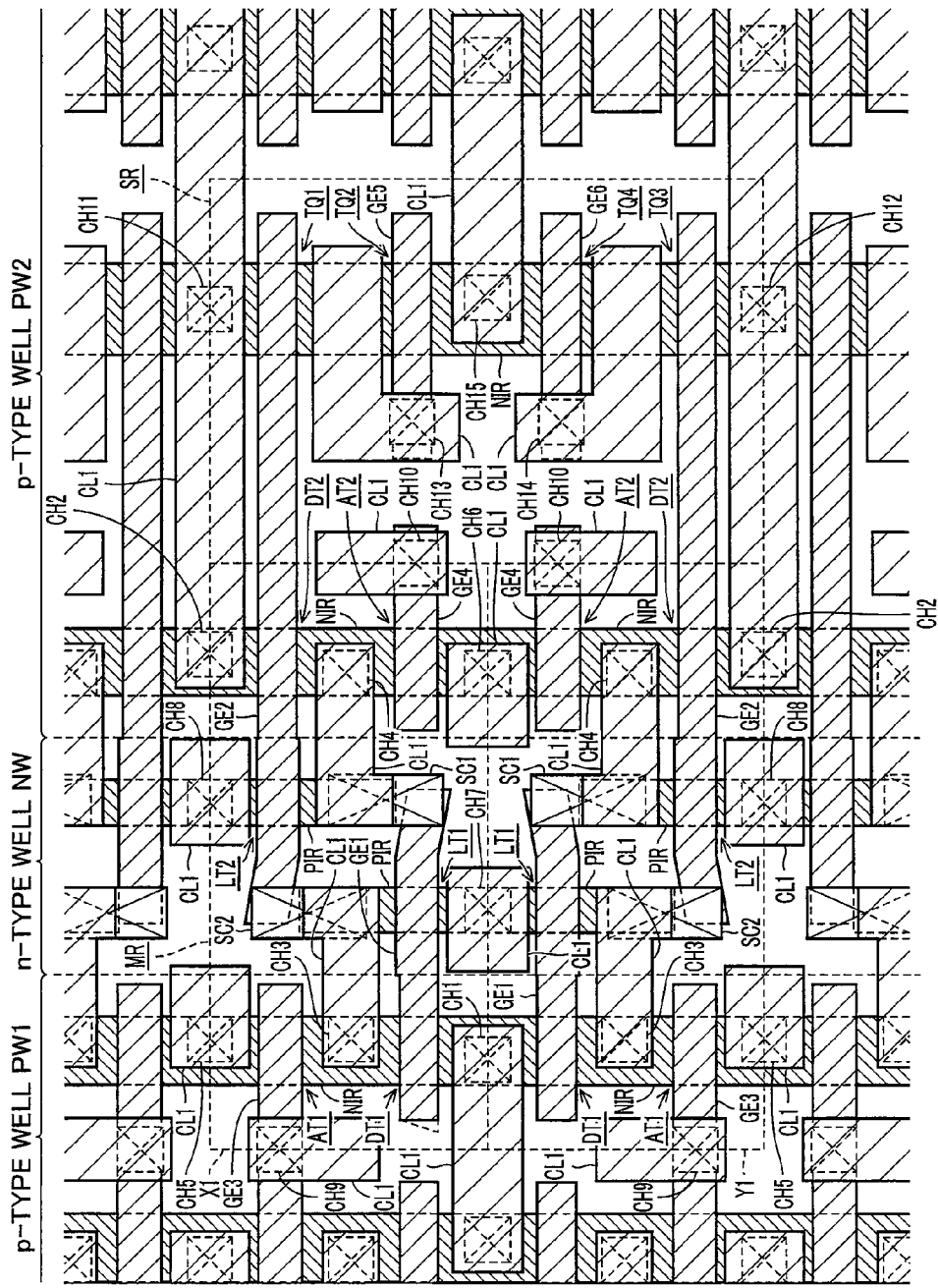
FIG. 41 is a plan view showing a planar layout of a TCAM cell to which the configuration of the fourth embodiment is applied.

Similarly the configuration of the second embodiment shown in FIG. 39 can be applied to the planar layout of the TCAM cell, the configuration of the third embodiment shown in FIG. 40 can be applied to the planar layout of the TCAM cell, and the configuration of the second embodiment shown in FIG. 41 can be applied to the planar layout of the TCAM cell.

In the configuration of the CAM memory cell, as shown in FIGS. 32 and 39 to 41, in the portion that shared contact hole SC1 of gate electrode layer GE1 reaches, sidewall E2 is retreated toward the side of sidewall E3 with respect to the virtual extended line of sidewall E1 in the planar view by combining with one of the shapes of gate electrode layers of the first to fourth embodiments. Therefore, the generation of the opening defect can be suppressed in forming shared contact hole SC1.

Similarly the generation of the opening defect can be suppressed for shared contact hole SC2.

The invention can particularly advantageously be applied to the semiconductor device having the shared contact hole that reaches both the gate electrode layer and the impurity region and the photomask used to perform the patterning of the gate electrode layer.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device including a first p-type MISFET, a first n-type MISFET, a second p-type MISFET, and a second n-type MISFET, comprising:
    a semiconductor substrate having a main surface;
    a first p-type impurity region formed in said main surface;
    a first n-type impurity region formed in said main surface;
    a second p-type impurity region formed in said main surface;
    a second n-type impurity region formed in said main surface;
    a first gate electrode formed over said first p-type impurity region and said first n-type impurity region;
    a second gate electrode formed over said second p-type impurity region and said second n-type impurity region; and
    an insulator film formed over said first p-type impurity region, said first n-type impurity region, said second p-type impurity region, said second n-type impurity region, said first gate electrode, and said second gate electrode,
    wherein said first p-type MISFET includes said first p-type impurity region and said first gate electrode,
    wherein said first n-type MISFET includes said first n-type impurity region and said first gate electrode,
    wherein said second p-type MISFET includes said second p-type impurity region and said second gate electrode,
    wherein said second n-type MISFET includes said second n-type impurity region and said second gate electrode,
    wherein said insulator film has a shared contact hole reaching both said first gate electrode and said second p-type impurity region,
    wherein said first gate electrode includes first, second, third, and fourth sidewalls, said first and third sidewalls being located opposite to each other, said second and fourth sidewalls being located opposite to each other, wherein, in a planar view, said second sidewall in a portion that said shared contact hole of said first gate electrode reaches is shifted toward sides of said third and fourth sidewalls from a virtual extended line of said first sidewall in portions located on said channel formation regions of said first p-type MISFET and said first n-type MISFET, and wherein, in a planar view, a center line of a line width in the portion that said shared contact hole of said first gate electrode reaches is located while shifted with respect to a center line of a line width in the portion located on said channel formation regions of said first p-type MISFET and said first n-type MISFET.

2. The semiconductor device according to claim 1, wherein said fourth sidewall of said first gate electrode in the portion that said shared contact hole reaches is located on a straight line identical to that of said third sidewall of said first gate electrode on said channel formation regions of said first P-type MISFET and said first n-type MISFET.

3. The semiconductor device according to claim 1, wherein said fourth sidewall of said first gate electrode in the portion that said shared contact hole reaches is located on a straight line different from that of said third sidewall of said first gate electrode on said channel formation regions of said first p-type MISFET and said first n-type MISFET.

4. The semiconductor device according to claim 1, wherein, in a planar view, said second sidewall of said first gate electrode in the portion that said shared contact hole reaches is parallel to said first sidewall of said first gate electrode on said channel formation regions of said first p-type MISFET and said first n-type MISFET.

5. The semiconductor device according to claim 1, wherein, in a planar view, said second sidewall of said first gate electrode in the portion that said shared contact hole reaches is inclined with respect to said first sidewall of said first gate electrode on said channel formation regions of said first p-type MISFET and said first n-type MISFET.

6. The semiconductor device according to claim 1, wherein first and second memory cells each of which includes said first p-type MISFET, said first n-type MISFET, said second p-type MISFET, and said second n-type MISFET are disposed adjacent to each other such that said third and fourth sidewalls of said first gate electrode of said first memory cell and said third and fourth sidewalls of said first gate electrode of said second memory cell face each other in a planar view, and a spacing between said first sidewall in the portion located on said channel formation regions of said first p-type MISFET and said first n-type MISFET of said first memory cell and said first sidewall in the portion located on said channel formation regions of said first p-type MISFET and said first n-type MISFET of said second memory cell is larger than a spacing between said second sidewall in the portion that said shared contact hole of said first gate electrode of said first memory cell reaches and said second sidewall in the portion that said shared contact hole of said first gate electrode of said second memory cell reaches.

7. The semiconductor device according to claim 1, wherein said first p-type MISFET, said first n-type MISFET, said second p-type MISFET, and said second n-type MISFET constitute a content addressable memory.

8. A semiconductor device including a first p-type MISFET, a first n-type MISFET, a second-type MISFET, and a second n-type MISFET, comprising:
 a semiconductor substrate having a main surface;
 a first p-type impurity region formed in said main surface;
 a first n-type impurity region formed in said main surface;
 a second p-type impurity region formed in said main surface;
 a second n-type impurity region formed in said main surface;
 a first gate electrode formed over said first p-type impurity region and said first n-type impurity region;
 a second gate electrode formed over said second p-type impurity region and said second n-type impurity region; and
 an insulator film formed over said first p-type impurity region, said first n-type impurity region, said second p-type impurity region, said second n-type impurity region, said first gate electrode, and said second gate electrode,
 wherein said first gate electrode includes a first portion and a second portion,
 wherein a width of said first portion is smaller than a width of said second portion,
 wherein said second gate electrode includes a third portion and a fourth portion,
 wherein a width of said third portion is smaller than a width of said fourth portion,
 wherein said first p-type MISFET includes said first p-type impurity region and said second portion of said first gate electrode,
 wherein said first n-type MISFET includes said first n-type impurity region and said second portion of said first gate electrode,
 wherein said second p-type MISFET includes said second p-type impurity region and said fourth portion of said second gate electrode,
 wherein said second n-type MISFET includes said second n-type impurity region and said fourth portion of said second gate electrode,
 wherein said insulator film has a first shared contact hole reaching both said first portion of said first gate electrode and said second p-type impurity region, and
 wherein said insulator film has a second shared contact hole reaching both said third portion of said second gate electrode and said first p-type impurity region.

9. The semiconductor device according to claim 8, wherein said first p-type MISFET, said first n-type MISFET, said second p-type MISFET, and said second n-type MISFET constitute an SRAM.

10. The semiconductor device according to claim 9, wherein said SRAM further includes a third n-type MISFET and a fourth n-type MISFET,
 wherein said third n-type MISFET includes said first n-type impurity region and a third gate electrode, and
 wherein said fourth n-type MISFET includes said second n-type impurity region and a fourth gate electrode.

* * * * *